United States Patent
Hong et al.

(10) Patent No.: US 6,696,324 B2
(45) Date of Patent: Feb. 24, 2004

(54) CONTACT STRUCTURES OF WIRINGS AND METHODS FOR MANUFACTURING THE SAME, AND THIN FILM TRANSISTOR ARRAY PANELS INCLUDING THE SAME AND METHODS FOR MANUFACTURING THE SAME

(75) Inventors: Mun-Pyo Hong, Kyungki-do (KR); Sang-Gab Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/751,840

(22) Filed: Jan. 2, 2001

(65) Prior Publication Data

US 2001/0019125 A1 Sep. 6, 2001

(30) Foreign Application Priority Data

Dec. 31, 1999 (KR) .......................... 1999-67763
Apr. 14, 2000 (KR) .......................... 2000-19711

(51) Int. Cl.[7] .......................... H01L 21/00; H01L 21/84
(52) U.S. Cl. .......................... 438/149; 438/151; 438/20; 438/30; 438/482; 438/488; 438/128; 257/72; 349/1; 349/42; 349/43
(58) Field of Search .......................... 438/149–160, 438/48, 20, 128, 30, 283, 482–91; 257/72; 349/1, 42, 43

(56) References Cited

U.S. PATENT DOCUMENTS

| | | | | |
|---|---|---|---|---|
| 5,185,294 A | * | 2/1993 | Lam et al. | 437/193 |
| 5,289,030 A | * | 2/1994 | Yamazaki et al. | 257/410 |
| 5,313,090 A | * | 5/1994 | Morikawa | 257/577 |
| 5,340,761 A | * | 8/1994 | Loh et al. | 437/44 |
| 5,403,772 A | * | 4/1995 | Zhang et al. | 437/101 |
| 5,573,959 A | * | 11/1996 | Kodaira et al. | 437/21 |
| 5,677,240 A | * | 10/1997 | Murakami et al. | 437/195 |
| 5,734,177 A | * | 3/1998 | Sakamoto | 257/49 |

(List continued on next page.)

FOREIGN PATENT DOCUMENTS

JP  3-238714  * 10/1991  ........... H01B/13/00

OTHER PUBLICATIONS

Ootani et al. "A 4–mb cmos sram with a pmos thin–film transistor load cell" IEEE journal of solid–state vol. 25 No. 5 10/90 p. 1082–1092.*
Jin et al. "High–performance polysrystalline si–ge thin–film transistor using Al203 gate insulators" IEEE electron device letters vol. 19 No. 12 12/98 p. 502–504.*
Lan et al. "An alternative transparent conducting oxide to ito for the a–si:h TFT–LCD applications" AMLCDs '95 p. 54–57.*

Primary Examiner—Matthew Smith
Assistant Examiner—Granvill D Lee, Jr.
(74) Attorney, Agent, or Firm—McGuireWoods LLP

(57) ABSTRACT

First, a conductive material made of aluminum-based material is deposited and patterned to form a gate wire including a gate line, a gate pad, and a gate electrode. A gate insulating layer is formed, and a semiconductor layer and an ohmic contact layer are sequentially formed. Next, a conductor layer including a lower layer of Cr and an upper layer of aluminum-based material is deposited and patterned to form a data wire include a data line intersecting the gate line, a source electrode, a drain electrode and a data pad. Then, a passivation layer is deposited and patterned to form contact holes exposing the drain electrode, the gate pad and the data pad, respectively. Next, an amorphous silicon layer is deposited, an annealing process is executed to form inter-layer reaction layers on the drain electrode, the gate pad and the data pad, which are exposed through the contact holes. Then, the amorphous silicon layer is removed. Next, IZO is deposited and patterned to form a pixel electrode, a redundant gate pad and a redundant data pad respectively and electrically connected to the drain electrode, the gate pad and the data pad via the inter-layer reaction layers.

38 Claims, 38 Drawing Sheets

U.S. PATENT DOCUMENTS

| | | | | |
|---|---|---|---|---|
| 5,837,619 A | * | 11/1998 | Adachi et al. | 438/795 |
| 5,969,377 A | * | 10/1999 | Seo | 257/72 |
| 6,017,779 A | * | 1/2000 | Miyasaka | 438/149 |
| 6,043,512 A | * | 3/2000 | Adachi | 257/66 |
| 6,159,779 A | * | 12/2000 | Huang et al. | 438/158 |
| 6,218,206 B1 | * | 4/2001 | Inoue et al. | 438/30 |
| 6,274,412 B1 | * | 8/2001 | Kydd et al. | 438/149 |
| 6,287,899 B1 | * | 9/2001 | Park et al. | 438/149 |
| 6,338,988 B1 | * | 1/2002 | Andry et al. | 438/158 |
| 6,340,610 B1 | * | 1/2002 | Ahn et al. | 438/158 |
| 6,362,028 B1 | * | 3/2002 | Chen et al. | 438/149 |
| 6,395,586 B1 | * | 5/2002 | Huang et al. | 438/149 |

\* cited by examiner

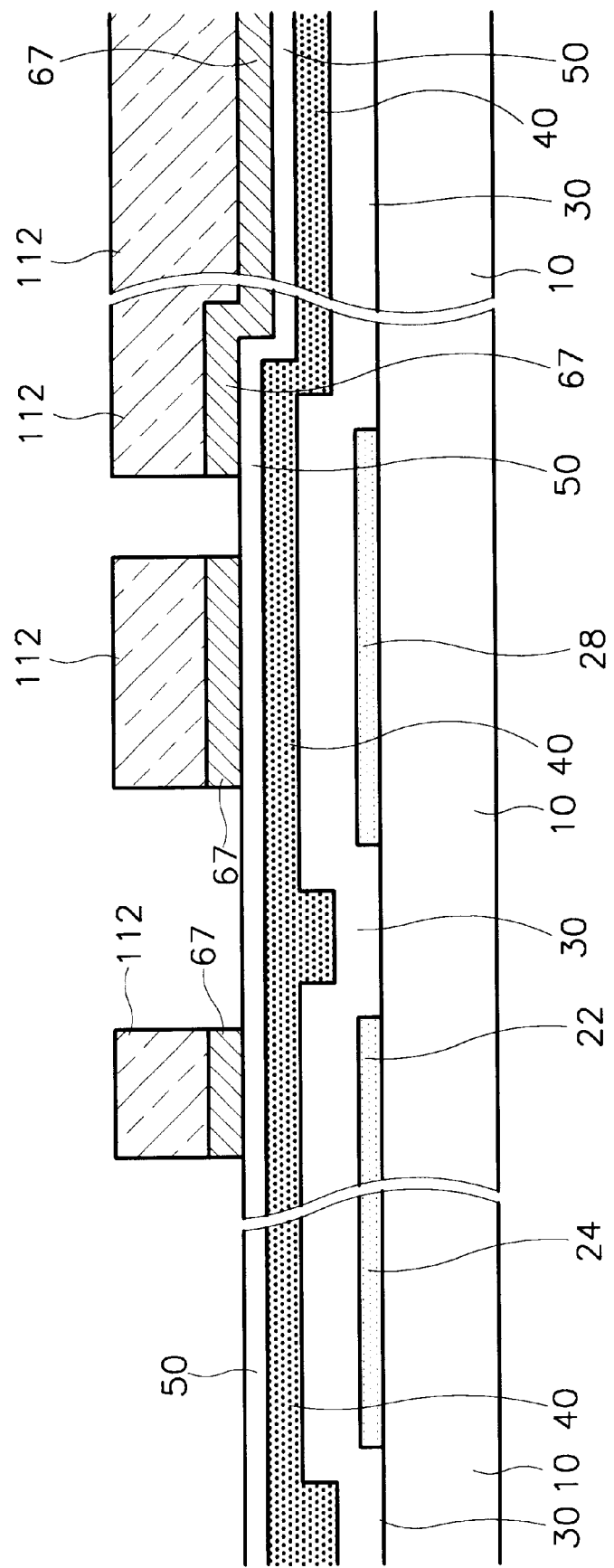

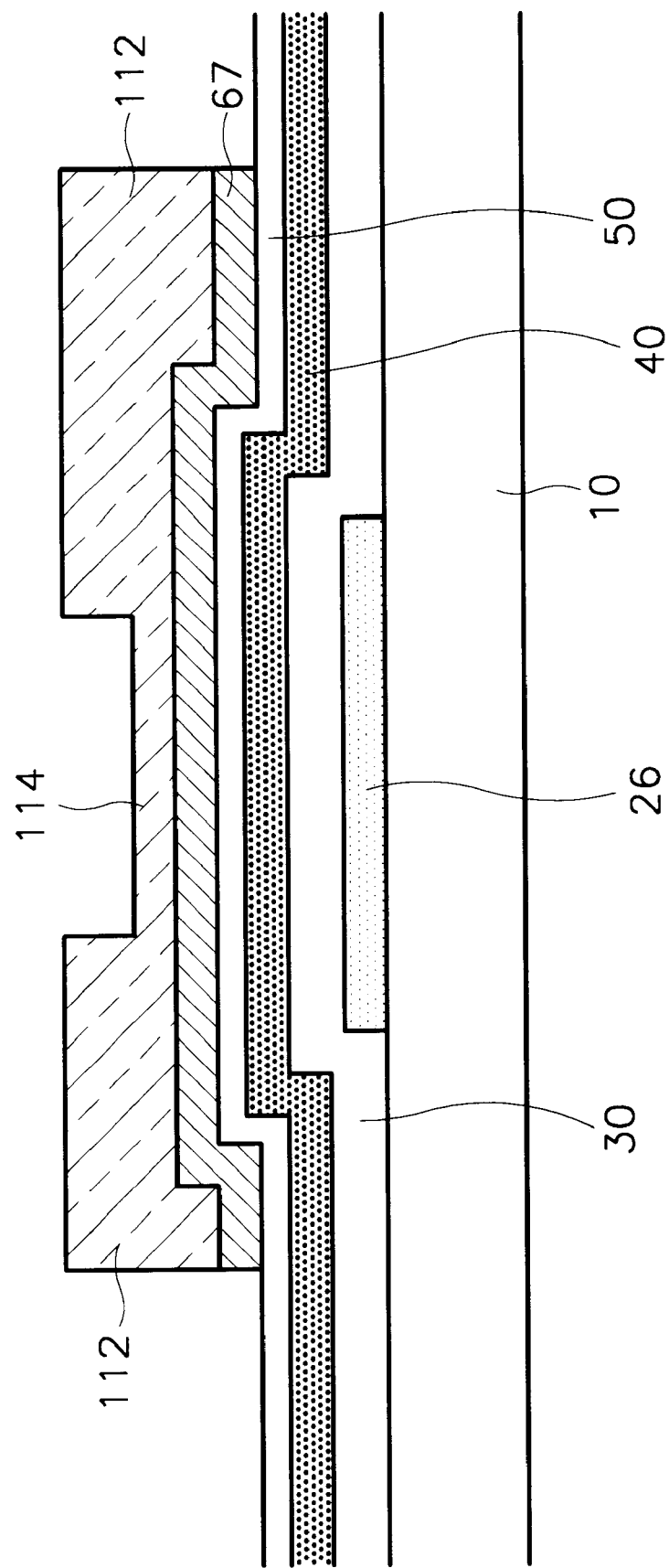

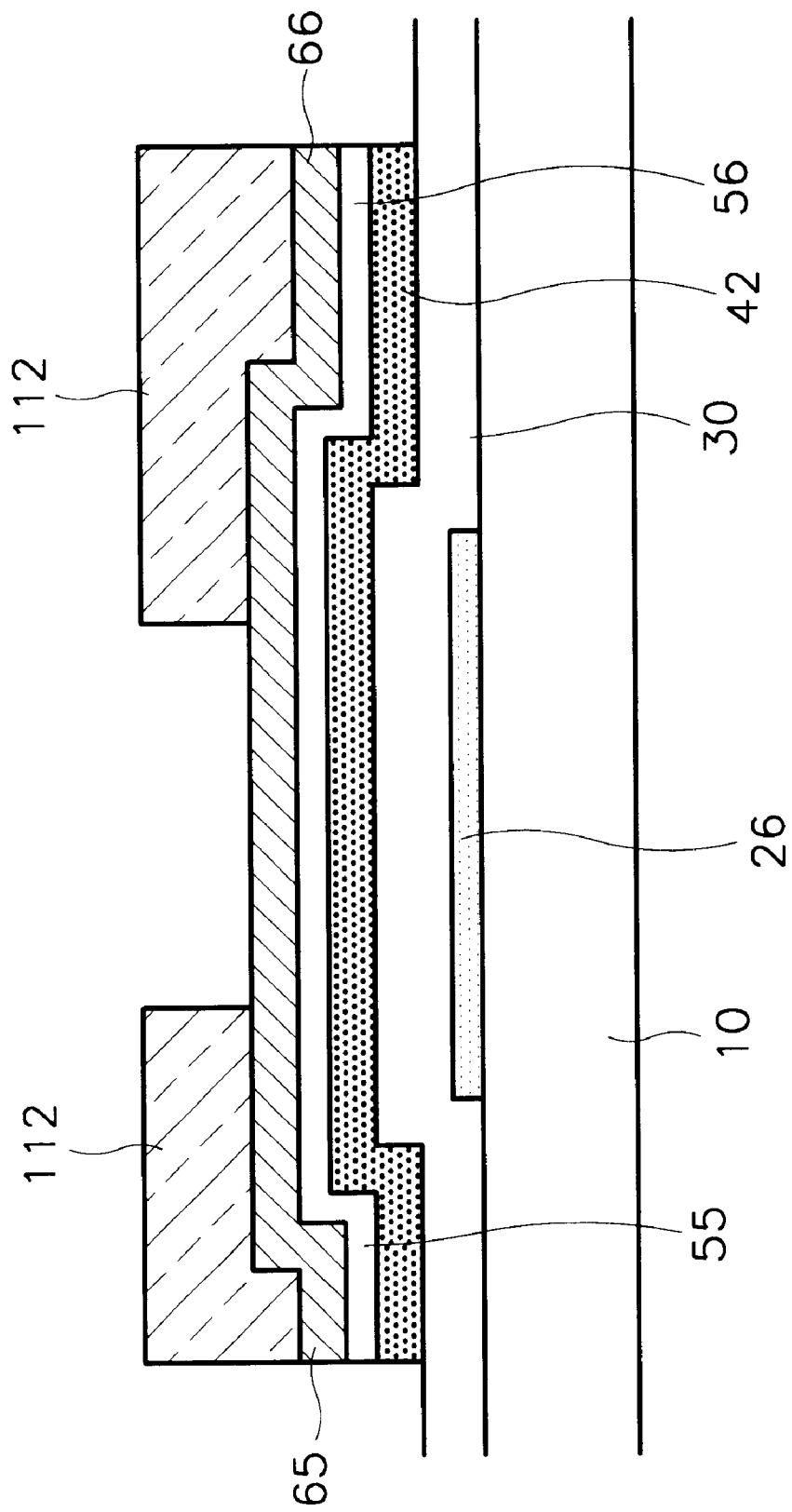

CONTACT STRUCTURES OF WIRINGS AND METHODS FOR MANUFACTURING THE SAME, AND THIN FILM TRANSISTOR ARRAY PANELS INCLUDING THE SAME AND METHODS FOR MANUFACTURING THE SAME

BACKGROUND OF THE INVENTION (a) Field of the Invention

The present invention relates to contact structures of wirings and methods for manufacturing the same, and thin film transistor array panels including the same and methods for manufacturing the same.

(b) Description of the Related Art

Generally, wiring of semiconductor devices is to transmit signals without delay.

In order to prevent delay or distortion of signals, materials having low resistivity such as aluminum or aluminum alloy are generally used. However, since the physical and the chemical properties of the aluminum or aluminum alloy is not good, that is, the aluminum or aluminum alloy is easily oxidized and corroded, when connecting other conductive material in a contact portions, accordingly the characteristics of semiconductor devices are deteriorated. To improve a contact properties of the wire made of aluminum and aluminum alloy, a different material is then inserted. However, to form the wire of multi-layered structure, several etchant to pattern the wire of multi-layered structure are needed, also many photolithography steps are needed. Accordingly, the manufacturing method is complicated and production costs are increased.

On the other hand, a liquid crystal display (LCD) is one of the most popular flat panel displays (FPDS). The liquid crystal has two panels having electrodes for generating electric fields and a liquid crystal layer interposed therebetween. The transmittance of incident light is controlled by the intensity of the electric field applied to the liquid crystal layer.

In the most widely used liquid crystal display, the field-generating electrodes are provided at both the panels, and one of the panels has switching elements such as thin film transistors.

In order to prevent delay or distortion of signals, materials having low resistivity such as aluminum or aluminum alloy are also used in the liquid crystal display. However, in the case that ITO (indium tin oxide) as a transparent electrode is used as a pixel electrode or to reinforce pad portions, because of the poor contact properties between aluminum or aluminum alloy and indium tin oxide (ITO), a different material is then inserted therebetween and the aluminum or aluminum alloy must be removed in the pad portions to prevent the corrosion of aluminum and aluminum alloy. Accordingly, the manufacturing method is complicated.

On the other hand, a thin film transistor array panel is manufactured by a photolithography process. Since the photolithography process is expensive, the number of the photolithography steps needs to be minimized.

SUMMARY OF THE INVENTION

It is therefore an object of the present invention to provide contact structures having good contact properties of wiring made a material of low resistivity and methods for manufacturing the same.

It is another object of the present invention to provide a thin film transistor array panels having contact structures of good contact properties and methods for manufacturing the same.

It is another object of the present invention to simplify manufacturing methods of thin film transistor array panels for liquid crystal displays.

These and other objects are provided, according to the present invention, by forming an inter-layer reaction layer on a wire through annealing process.

In a contact structure of a wire and a method for manufacturing the same according to the present invention, a wire made of a metal is formed on a substrate, and an inter-layer reaction layer is formed on the wire. Next, a conductive layer, which is electrically connected to the wire via the inter-layer reaction layer, is formed.

It is desirable that the wire is made of aluminum-based material, and the inter-layer reaction layer may include silicon or transition metal. Here, an insulating layer having a contact hole may be added between the wire and the conductive layer, the insulating layer may formed before forming the inter-layer reaction or after forming the inter-layer reaction.

The inter-layer reaction layer is formed through annealing process as thermal treatment, and annealing process is executed in the range of 200–400° C.

The conductive layer may be formed of a transparent conductive material, which does not generate battery reaction when contacting with the metal of aluminum-based material, such as indium zinc oxide.

To form the inter-layer reaction layer, the buffer layer of a transition metal, or an amorphous silicon or doped amorphous silicon is deposited, and annealed. The buffer layer may be removed, or not, and patterned.

The contact structure of the wire and the method for manufacturing the same may be adapted to a manufacturing method of a thin film transistor array panel.

First, a gate wire, a data wire and a semiconductor layer are formed, and an insulating layer covering them is formed. Then, an inter-layer reaction layer including at least silicon or transition metal is formed on the gate wire and the data wire. The insulating layer is patterned to form a contact hole exposing the gate wire and/or the data wire. Next, a transparent conductive layer electrically connected to the gate wire and/or the data wire via the inter-layer reaction layer is formed.

It is desirable that the gate wire and/or the data wire include a conductive material of aluminum-based metal and the conductive layer is made of indium zinc oxide.

More concretely, a conductive layer is deposited and patterned on an insulating substrate to form a gate wire including a gate line and a gate electrode connected to the gate line, and a gate insulating layer is deposited. A semiconductor layer is formed, and a conductive layer is deposited thereon and patterned to form a data wire including a data line intersecting the gate line, a source electrode connected to the data line and adjacent to the gate electrode and a drain electrode opposite of the source electrode with respect to the gate electrode. Next, a passivation layer is deposited and patterned to form a first contact hole exposing the drain electrode. Then, a pixel electrode electrically connected to the drain electrode through the first contact hole is formed on the passivation layer. At this time, inter-layer reaction layer is formed on the gate wire and/or the data wire.

Here, it is desirable that the inter-layer reaction layer is formed through thermal treatment using annealing step, the gate wire and the data wire include aluminum-based material, the pixel electrode is made of a transparent conductive material such indium zinc oxide.

The gate wire further comprises a gate pad connected to the gate line, and the data wire further comprises a data pad connected to the data line, and the passivation layer has a second and a third contact hole along with the gate insulating layer respectively exposing the gate pad and the data pad. A redundant data pad and a redundant gate pad, which are respectively and electrically connected to the gate pad and the data pad through a second and a third contact holes of the passivation layer, may be formed when forming the pixel electrode. At this time, the inter-layer reaction layer is extended on the gate pad and/or the data pad.

Here, the step of executing a wet cleaning process using etchant or a dry cleaning process using plasma may be executed before forming the inter-layer reaction layer.

The data wire and the semiconductor layer are together formed by photolithography process using a photoresist pattern having different thicknesses depending the positions. The photoresist pattern may have a first portion having a first thickness, a second portion having a second thickness larger than the first portion, and a third portion having a third thickness smaller than the first thickness and except for the first and the second portions.

A mask used for forming the photoresist pattern may have a first, a second, and a third part, a transmittance of the third part is higher than the first and the second parts, a transmittance of the first part is higher than the second part. The first and the second portion of the photoresist pattern may be respectively aligned on portion between the source electrode and the drain electrode, and the data wire.

It is desirable that the first part of the mask includes a partially transparent layer, or a slit pattern smaller than the resolution of the exposure used in the exposing step, to regulate the transmittance of the first part, and the thickness of the first portion is less than the half of the thickness of the second portion.

An ohmic contact layer may be formed between the data wire and the semiconductor layer, and the data wire, the ohmic contact layer, and the semiconductor layer may be formed in the same photolithography process.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 17A, 18A, and 19A are cross-sectional views in the next manufacturing step following that represented in FIGS. 16B taken along the line XVIB–XVIB' of FIG. 16A.

FIGS. 17B, 18B, and 19B are cross-sectional views in the next manufacturing step following that represented in FIG. 16C taken along the line XVIC–XVIC' of FIG. 16A.

DETAILED DESCRIPTION OF THE PREFERRED EMBODIMENTS

Figure 1:
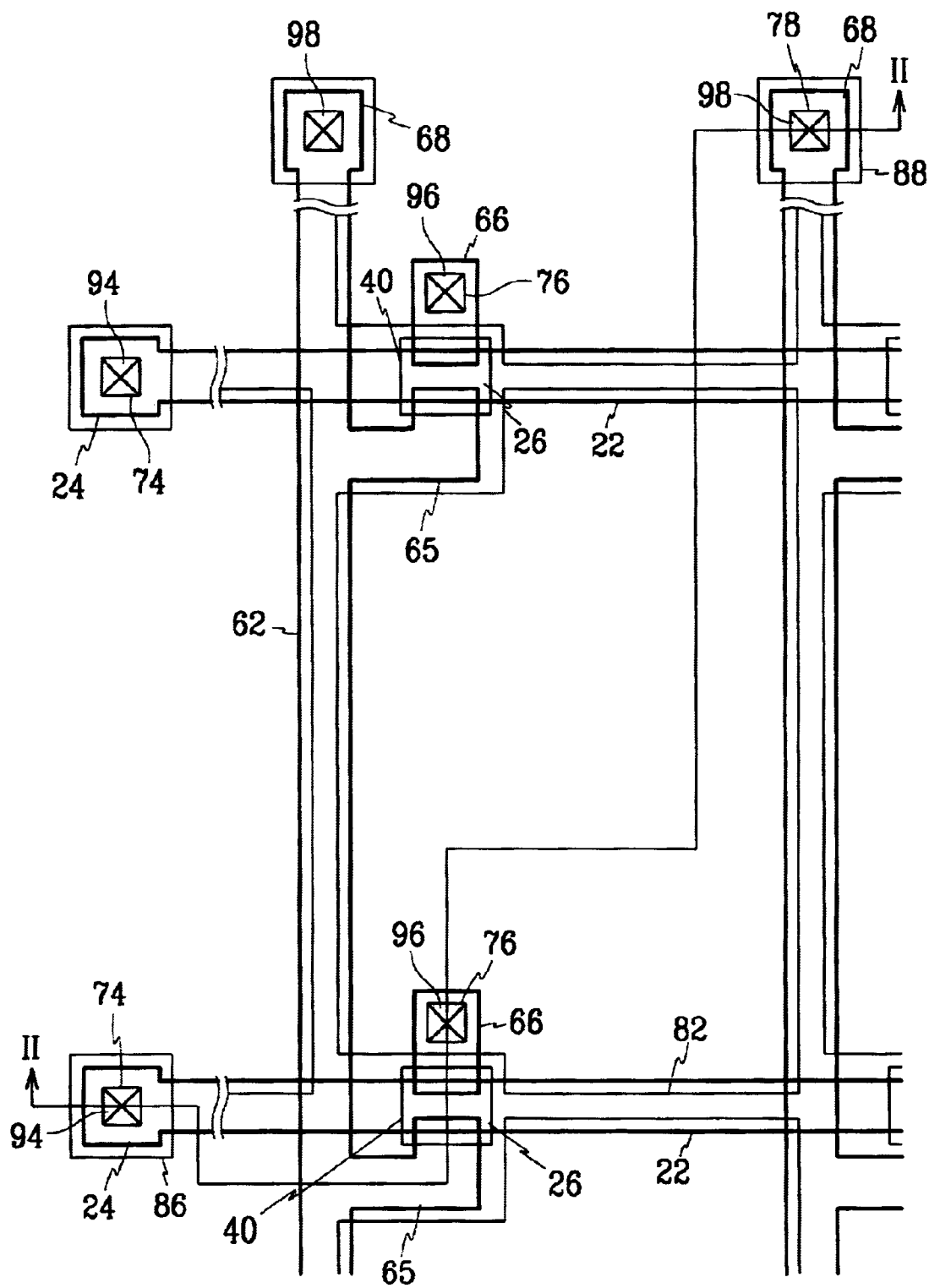
FIG. 1 is a layout view of a thin film transistor array panel for a liquid crystal display according to the first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

A wiring of a semiconductor device is made of a material, which has a low resistivity less than 15 $\mu\Omega$cm, such as aluminum, aluminum alloy. This wiring generally is connected to different conductive layer to receive external electrical signals from outside or to deliver electrical signals to outside. The wiring should not be easily corroded on the connection to the different conductive layer during manufacturing processes. In a contact structure of a wiring and a method for manufacturing the same according to the present invention, a wiring of a metal layer made of material having low resistivity such as aluminum, aluminum alloy is formed on a substrate, and a buffer layer including a metal or silicon is deposited on the wire. Next, annealing step as thermal treatment process is executed to form an inter-layer reaction layer between the wire and the buffer layer. Then, a conductive layer electrically connected to the wire via the inter-layer reaction layer through a contact hole of an insulating layer is formed.

Here, the inter-layer reaction layer may be formed before forming the insulating layer or after forming the contact hole.

At this time, it is preferable that the wire is made of a conductive material of aluminum-based material, and the conductive layer is made of transparent conductive material, which causes battery reaction with aluminum-based material, such as IZO (indium zinc oxide).

Also, it is preferable that the silicon may be an amorphous silicon or a doped amorphous silicon, and the metal may be transition metal.

Here, it is desirable that the annealing step is executed in the range of 200–400° C.

Here, the inter-layer reaction layer plays a role reducing contact resistance between the wires of aluminum-based material, and the conductive layer of IZO.

This wire may be used as a gate wire or a data wire of a thin film transistor array panel for liquid crystal display.

A structure of the TFT array panel and a method for manufacturing the same will now be described specifically.

First, the structure of a TFT array panel for liquid crystal display according to the first embodiment of present invention will now be described specifically with reference to FIGS. 1 and 2.

Figure 2:
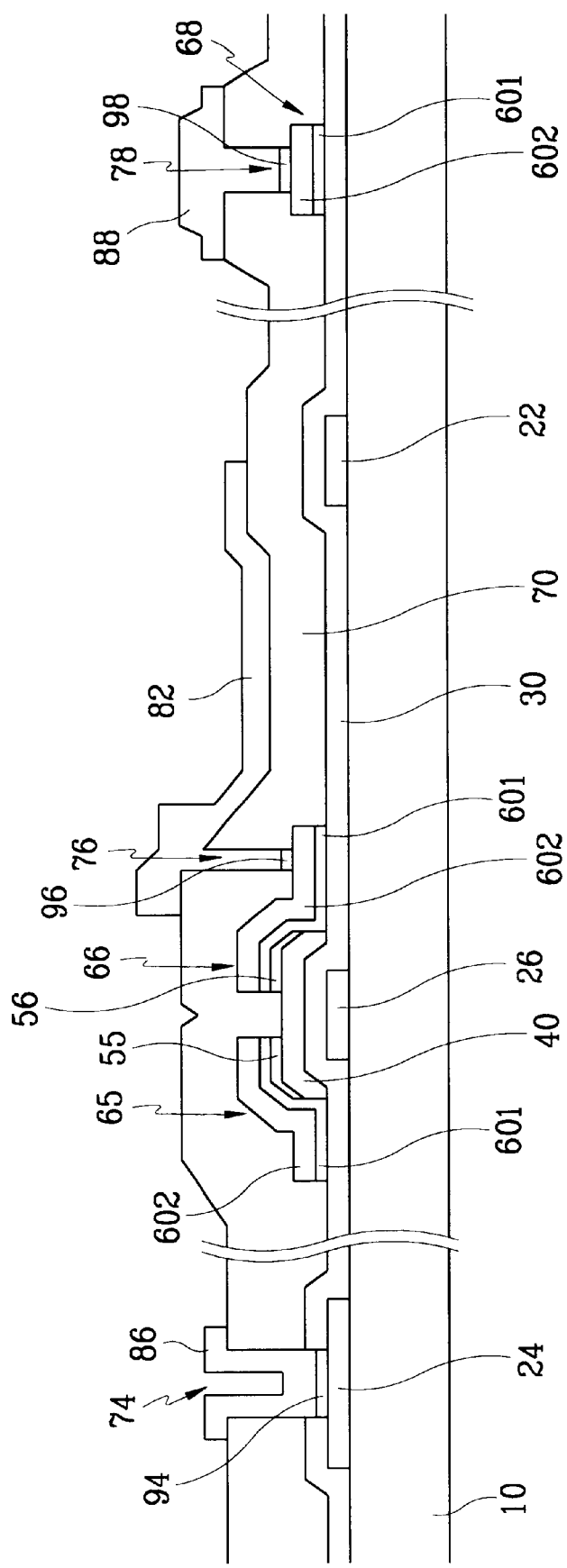
FIG. 2 is cross-sectional view taken along lines II–II' of FIG. 1.

FIG. 1 is a layout view of a thin film transistor array panel for a liquid crystal display according to the first embodiment of the present invention, and FIG. 2 is the cross-sectional view taken along line II–II' of FIG. 1.

Gate wires made of conductive material having low resistivity, such as aluminum (Al) or aluminum alloy (Al alloy), is formed on an insulating substrate 10. A gate wire includes a gate line (or scanning signal line) 22 extending in the horizontal direction in FIG. 1, a gate pad 24 connected to an end of the gate line 22 and which transmits a scanning signal from an external circuit to the gate line 22, and a gate electrode 26 which is a part of a thin film transistor and connected to the gate line 22.

A gate insulating layer 30 of silicon-nitride (SiNx) is formed on and covers the gate wire parts 22, 24, and 26.

A semiconductor layer 40 (made of semiconductor such as hydrogenated amorphous silicon) is formed in an island-like shape on the gate insulating layer 30 of the gate electrode 26. Ohmic contact layers 55 and 56 (made of such materials as silicide or hydrogenated amorphous silicon heavily doped with impurities like phosphorus) are formed on the semiconductor layer 40.

A data wire made of conductive materials such as Mo or MoW alloy, Cr, Ta and Ti are formed on the ohmic contact layer patterns 55 and 56 and the gate insulating layer 30. The data wire has a data line 62 extending in the vertical direction in FIG. 1 and defining a pixel along with the gate line 22, a data pad 68 connected to an end of data line 62 and which transmits image signals from an external circuit to the data line 62, a source electrode 65 of a thin film transistor which is connected to the data line 62 and is extended on the ohmic contact layer 55, and a drain electrode 66 of the thin film transistor that is formed on the ohmic contact layer 56 opposite the source electrode 65 with respect to the gate electrode 26 and which is separated from the source electrode 65.

The data wire parts 62, 65, 66, and 68 may have a multiple-layered structure. When the data wire has a multiple-layered structure, it is preferable that one layer is made of a material having low resistivity and another is made of a material having good contacting properties with other materials. Double layers of Cr/Al (or Al alloy) and Al/Mo are such examples. The data wire parts 62, 65, 66, and 68 includes a lower layer 601 made of Cr and an upper layer 602 made of Al alloy.

A passivation layer 70 of an insulating material such as SiNx is formed on the data wire parts 62, 65, 66, and 68, and the semiconductor layer 40, which is not, covered by the data wire parts 62, 65, 66, and 68.

The passivation layer 70 has contact holes 76 and 78 respectively exposing the drain electrode 66 and the data pad 68, and also has (along with the gate insulating layer 30) another contact hole 74 exposing the gate pad 24.

Inter-layer reaction layers 94, 96 and 98, which include at least $Al_xSi_x$ made of aluminum and silicon, or inter-metallic compound, are at least formed on the portion of the gate pad 24, the drain electrode 66 and the data pad 68, which are exposed through contact holes 74, 76 and 78. Here, the inter-layer reaction layers 94, 96 and 98 have the function improving contact prosperities between the gate pad 24 and the upper layer 602 of the drain electrode 66 and the data pad 68, which is made of aluminum-based material, and a pixel wire 82, 86 and 88 of IZO, which will be formed later. It is preferable that the inter-metallic compound includes transition metal such as chromium, molybdenum, molybdenum alloy etc.

A pixel electrode 82, which receives an image signal and generates an electric field with a common electrode of an upper panel, is formed on the passivation layer 70 of the pixel. The pixel electrode 82 is physical connected to the inter-layer reaction layer 96 on the drain electrode 66 through the contact hole 76, and receives the image signal from the drain electrode 66. A redundant gate pad 86 and a redundant data pad 88, respectively connected to the inter-layer reaction layers 94 and 98 on the gate pad 24 and to the data pad 68 through the contact holes 74 and 78, are formed on the passivation layer 70. Here, the pixel wire including the pixel electrode 82, and the gate and data pads 86 and 88 are made of IZO.

Here, as shown in FIGS. 1 and 2, the pixel electrode 82 overlaps the gate lines 22 to make a storage capacitor. If there is not enough storage capacitance with this configuration, a storage wire may be formed with the same layer as the gate wire parts 22, 24, and 26.

With the structure of the thin film transistor array panel according to present invention, by forming the gate wire 22, 24, 26 and the data wire 62, 64, 66 and 68 by using aluminum and aluminum alloy, the delay and distortion of signals may be prevented in large scale LCDs. Also, the inter-layer reaction layers 94, 98 and 96 are formed between the gate pad 24, the data pad 68 and the drain electrode 66, and the redundant gate pad 86, the redundant data pad 88 and the pixel electrode 82 to improve contact prosperities of them, accordingly the contact resistance of contact structure in the contact holes 74, 76 and 78 may be minimized, and are not corroded, therefore a reliable pad portion may be obtained.

On the other hand, in the structure according to the first embodiment of the present invention, the inter-layer reaction layer 94, 96 and 98 are is formed inside the contact holes 74, 76 and 78, however a contact improvement layer made of transition metal and covering the contact holes 74, 76 and 78 may be formed.

The structure of a TFT array panel for liquid crystal display according to the second embodiment of present invention will now be described specifically with reference to FIGS. 3 and 4.

Figure 3:
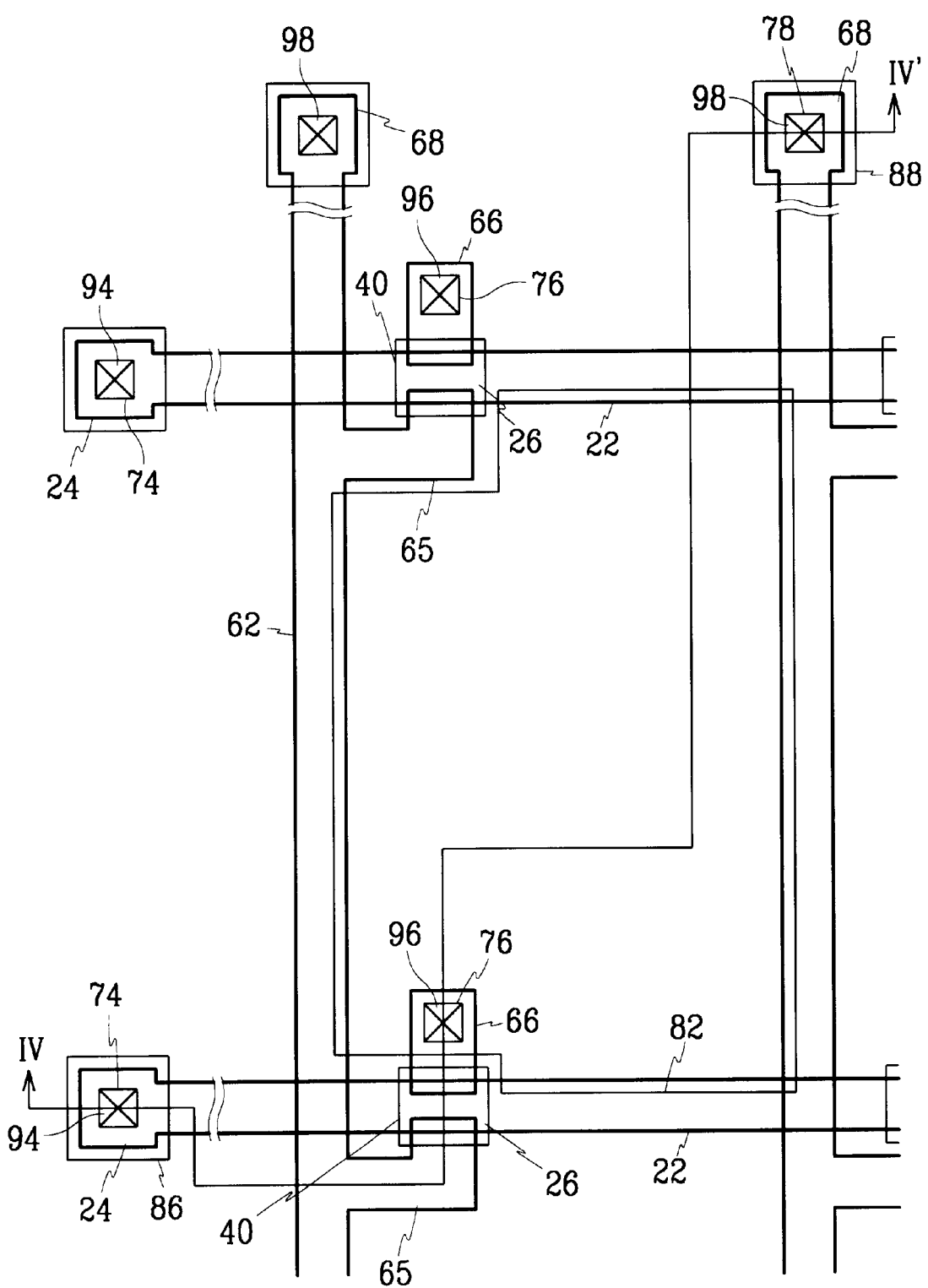
FIG. 3 is a layout view of a thin film transistor array panel for a liquid crystal display according to the second embodiment of the present invention.
Figure 4:
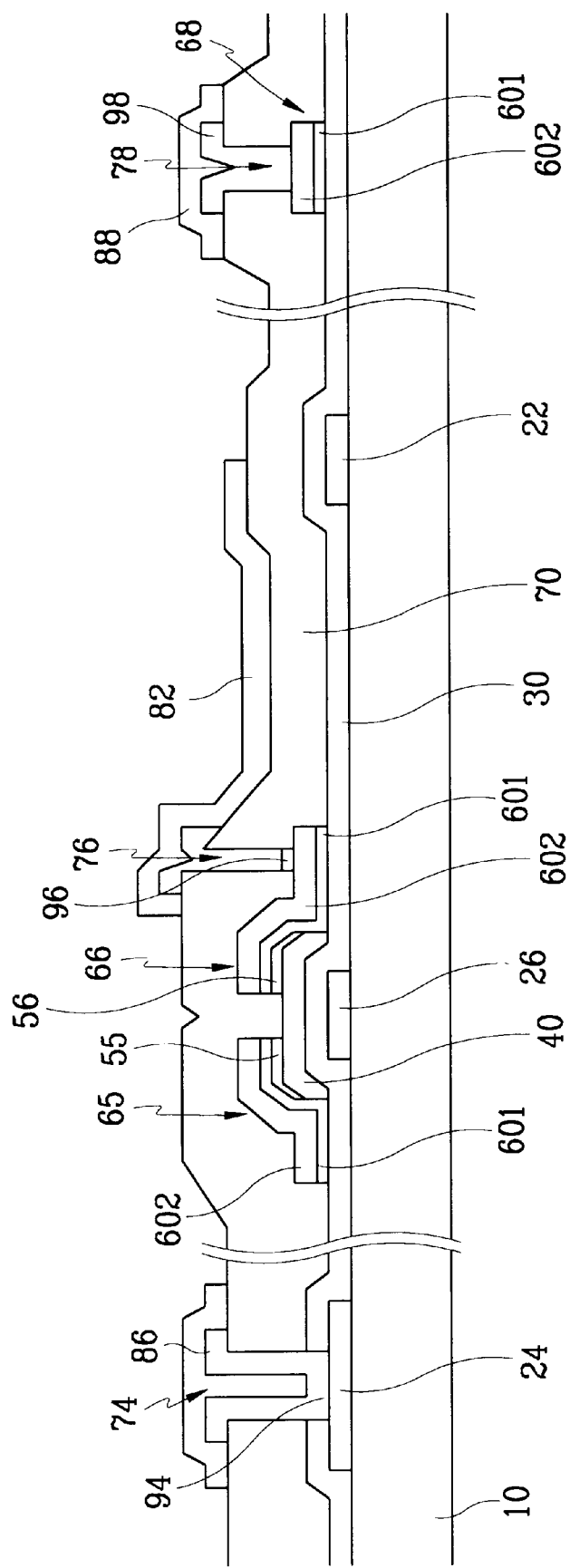
FIG. 4 is cross-sectional view taken along lines IV–IV' of FIG. 3.

FIG. 3 is a layout view of a thin film transistor array panel for a liquid crystal display according to the second embodiment of the present invention, and FIG. 4 is the cross-sectional view taken along line IV–IV' of FIG. 3.

As shown in FIGS. 3 and 4, most of structure according to the second embodiment is the same as that of the first embodiment of FIGS. 1 and 2.

However, contact improvement layer 94, 96 and 98 cover contact holes 74, 76 and 78, and a redundant gate pad 86, a pixel electrode 82 and a redundant data pad 98 completely cover contact improvement layer 94, 96 and 98, respectively.

A manufacturing method of a thin film transistor array panel according to the first and the second embodiments of the present invention will now be described with reference to the FIGS. 5A to 10B and FIGS. 1 to 4.

Figure 5A:
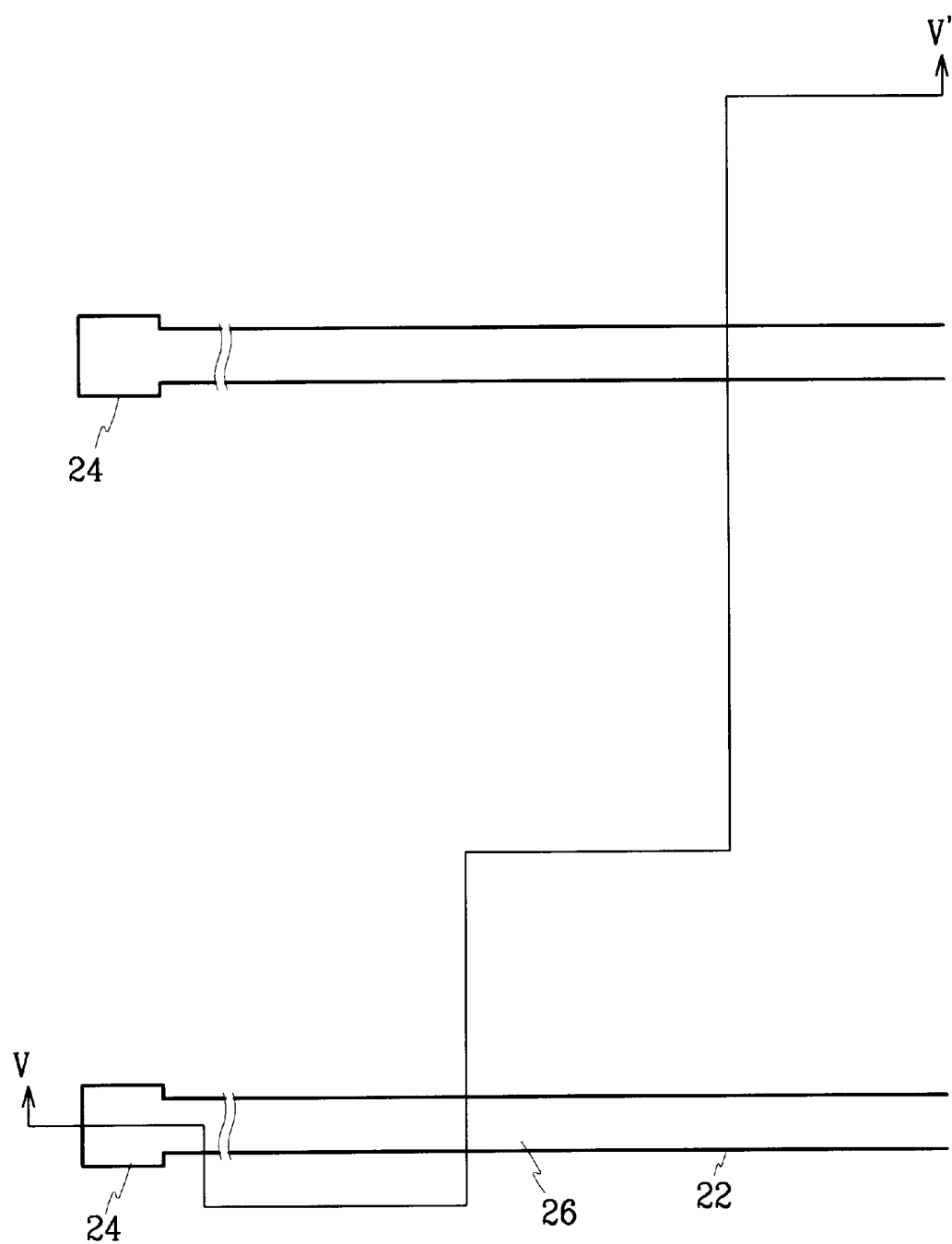
FIGS. 5A, 6A, 7A, 8A and 9A are layout views of the thin film transistor array panel according to the first embodiment of the present invention at middle manufacturing steps of a manufacturing method.
Figure 5B:
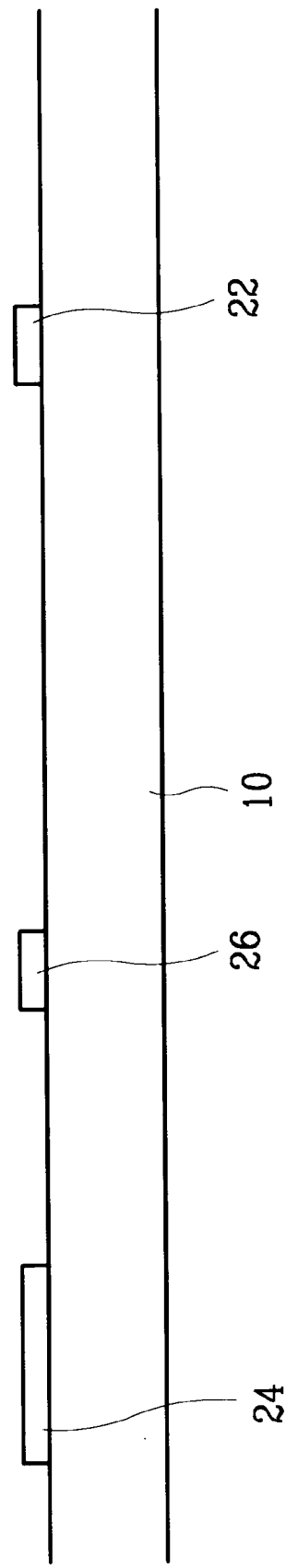
FIG. 5B is cross-sectional view taken along the line VB–VB' of FIG. 5A.

At first, as shown in FIGS. 5A and 5B, a conductive layer having low resistivity such as aluminum or aluminum alloy are deposited and patterned. Preferably, in this embodiment, a target of Al—Nd alloy including 2 at % (atomic percentage) of Nd was sputtered at a temperature of about 150° C. to form the conductive layer at a thickness of about 2,500 Å on the substrate 10, then the conductive layer is patterned to form gate wire parts including a gate line 22, a gate electrode 26, and a gate pad 24 by dry or wet etching the conductive layer through a photolithography process.

Figure 6A:
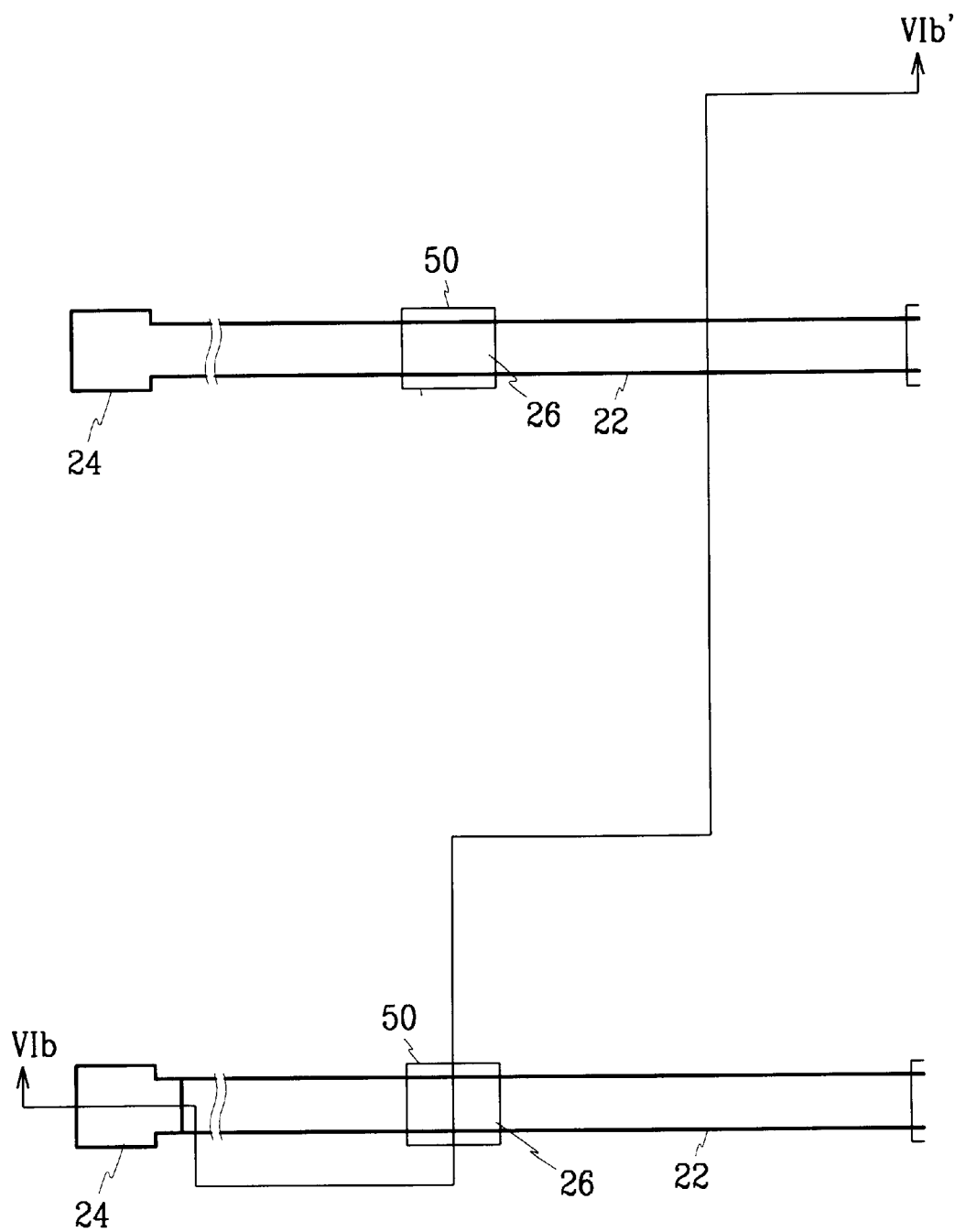
Figure 6B:
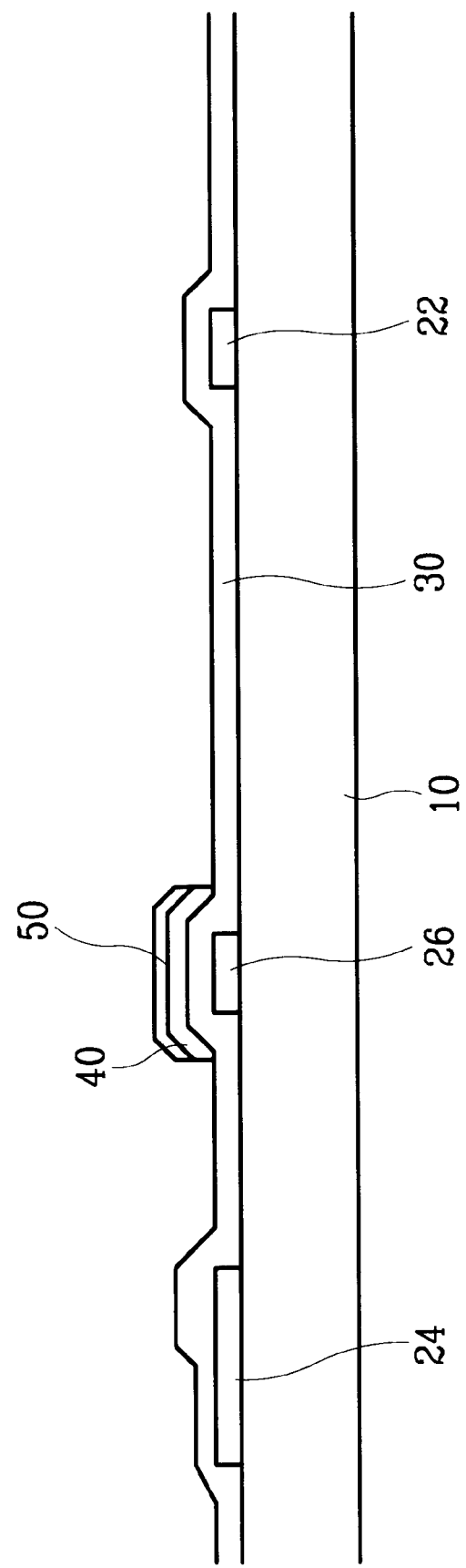
FIG. 6B is cross-sectional view taken along the line VIB–VIB' of FIG. 6A at the next manufacturing step following that represented in FIG. 3B.

Next, as shown in FIGS. 6A and 6B, a gate insulating layer 30, a amorphous silicon semiconductor layer 40, and a doped amorphous silicon ohmic contact layer 50 are sequentially layered. Then, the semiconductor layer 40 and ohmic contact layer 50, which are both island shaped, are formed on top of the gate electrode 26 and the opposing gate insulating layer 30 using a mask patterning process.

Figure 7A:
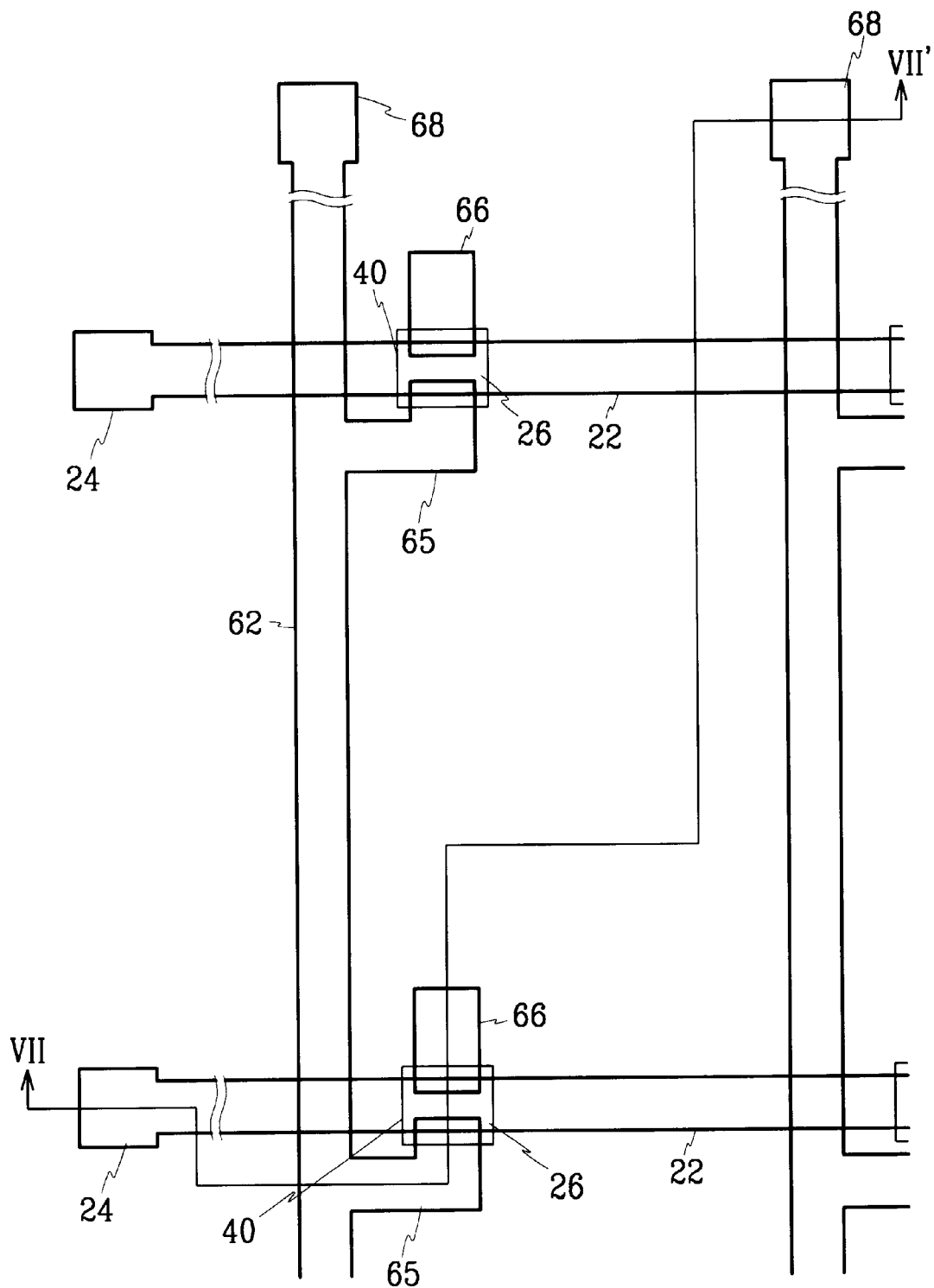
Figure 7B:
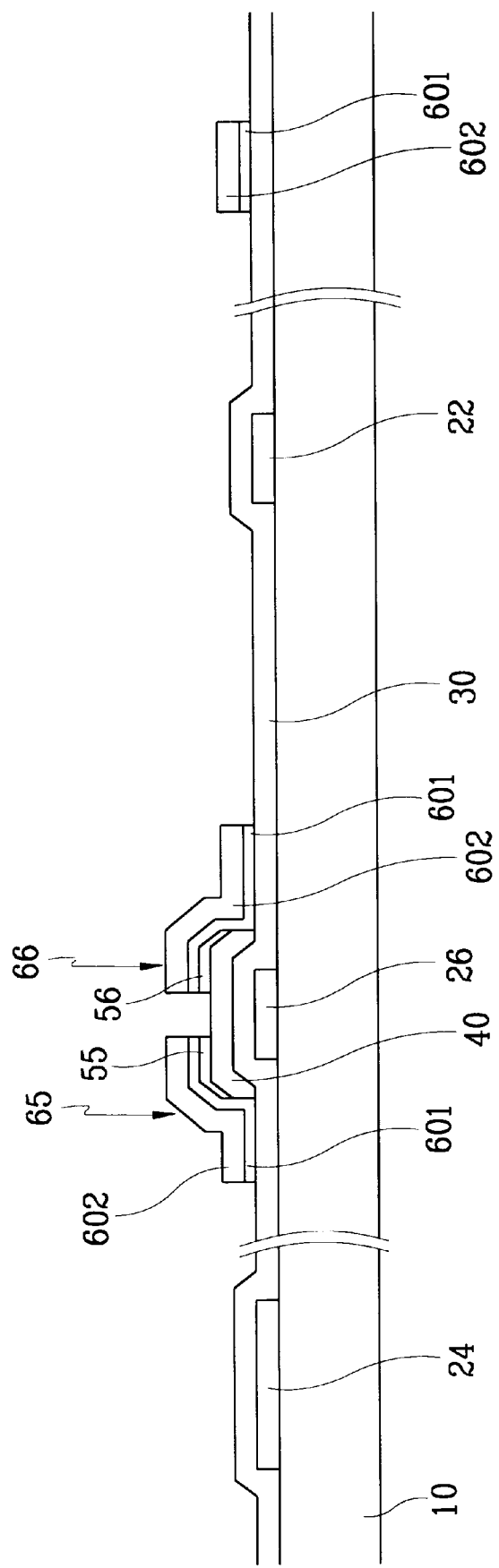
FIG. 7B is cross-sectional view taken along the line VIIB–VIIB' of FIG. 7A at the next manufacturing step following that represented in FIG. 6B.

Then, as shown in FIGS. 7A and 7B, a lower layer 601 such as chromium, molybdenum, molybdenum alloy, titanium or tantalum, and a upper layer 602 having low resistivity such as aluminum or aluminum alloy are respectively deposited at thickness of more than 300 Å and about 2500 Å by such methods as sputtering and patterned through a photolithography process using a mask to form a data wire including a data line 62 intersecting the gate line 22, a source electrode 65 connected to the data line 62 and extended over the gate electrode 26, a drain electrode 66 separated from the source electrode 65 and opposite the source electrode 65 with respect to the gate electrode 22, and a data pad 68 connected to the end of the data line 62. Here, the upper and the lower layers 602 and 601 may be all wet-etched, and the upper and the lower layers 602 and 601 may be wet-etched and dry-etched, respectively.

Then, the ohmic contact layer 50 is etched by using the data wires 62, 65, 65, and 68 as a mask and a plasma dry etch to divide the ohmic contact layer 50 with the center of the gate electrode 26, and to expose the central portion of the amorphous silicon layer 40 between the ohmic contact layers 55 and 56. Oxygen plasma may be executed to obtain the stabilization of the surface of the amorphous silicon layer 40.

After forming data wire parts 62, 65, 66, and 68 by the above steps, a passivation layer 70 of an insulator such as silicon-nitride or organic material is deposited and patterned along exposing the gate pad 24, the drain electrode 66, and the data p with the gate insulating layer 30 to form contact holes 74, 76, and 78 respectively ad 68. Here, it is desirable that the metal layer of aluminum-based material should not be etched in etch condition when forming the contact holes 74, 76 and 78, and fluorine group as an etch gas may be used such $SF_6/O_2$.

Figure 9A:
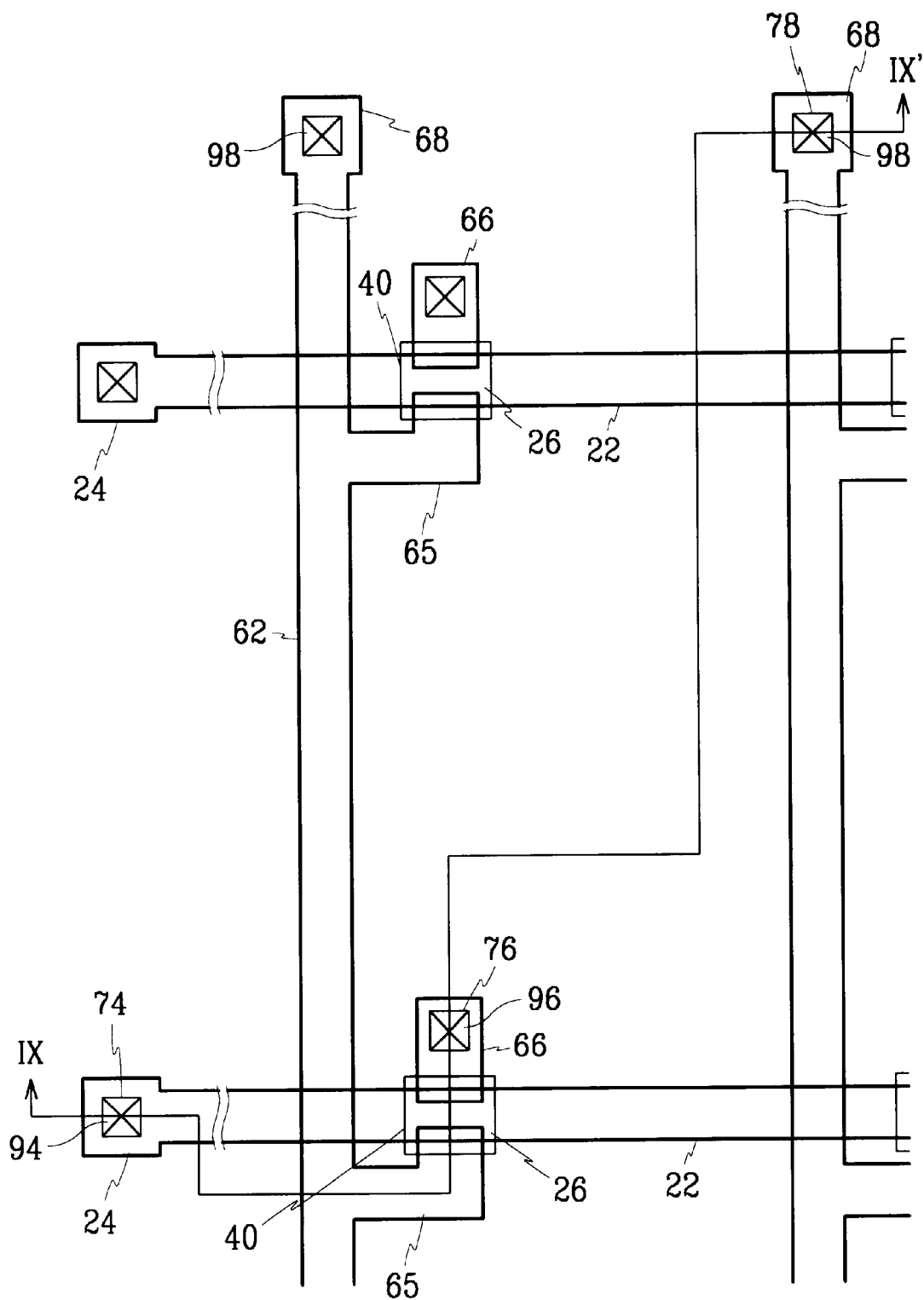
Figure 9B:
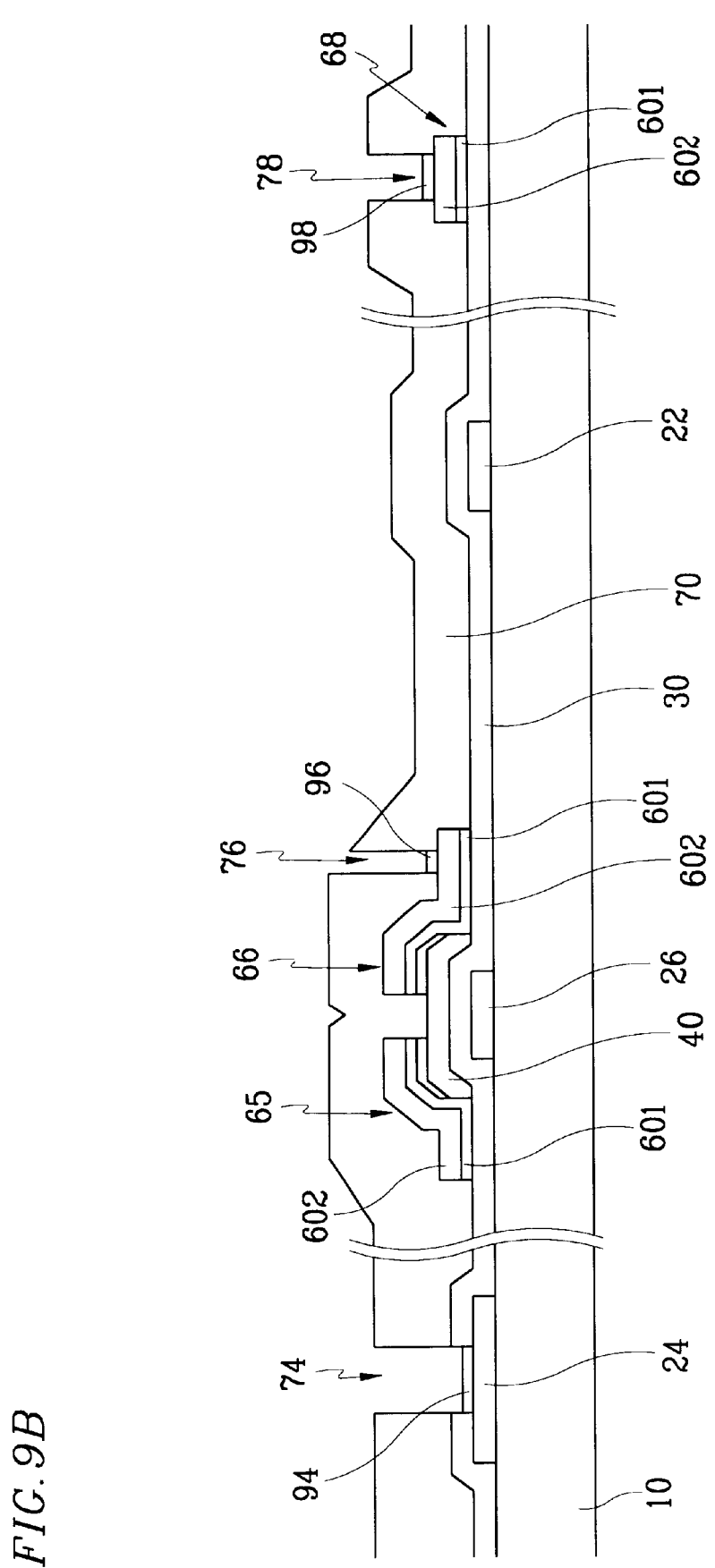
FIG. 9B is cross-sectional view taken along the line IXB–IXB' of FIG. 9A at the next manufacturing step following that represented in FIG. 8B.

Next, as shown in FIGS. 9A and 9B, a silicon layer such as an amorphous silicon or a doped amorphous silicon, or a transition metal layer such as chromium, molybdenum, molybdenum alloy or titanium is deposited at thickness of about 500 Å or more than 200 Å on the substrate 10 to form a inter-layer reaction layer improving contact prosperities between IZO and metal layer of aluminum-based material. Then, anneal process is executed in the range of 200–400° C. to form a inter-layer reaction layer 94, 96 and 98 including $Al_xSi_x$ or a transition metal layer such as chromium, molybdenum, molybdenum alloy or titanium on aluminum-based layer of the gate pad 24, and the upper layer 602 of the drain electrode 66 and the data pad 68. Next, a whole etch process is executed to remove the silicon layer or the transition metal layer. At this time, the silicon layer or the transition metal layer is removed, but the inter-layer reaction layer 94, 96 and 98 are remained. In this embodiment, the transition layer is deposited at thickness of about 300 Å, the annealing process is executed during about 30 minute, and the inter-metallic compound layer 94, 96 and 98 as the inter-layer reaction layer is formed at thickness of less than 60 Å.

Here, to improve the quality of the inter-layer reaction layer 94, 96 and 98 formed on the metal layer 24 and 602 made of aluminum-based material, a wet cleaning process using an etchant or a dry cleaning process using plasma may be executed after forming the contact holes 74, 76 and 78 to clean the surface of the metal layer 24 and 602 of aluminum-based material.

Figure 10A:
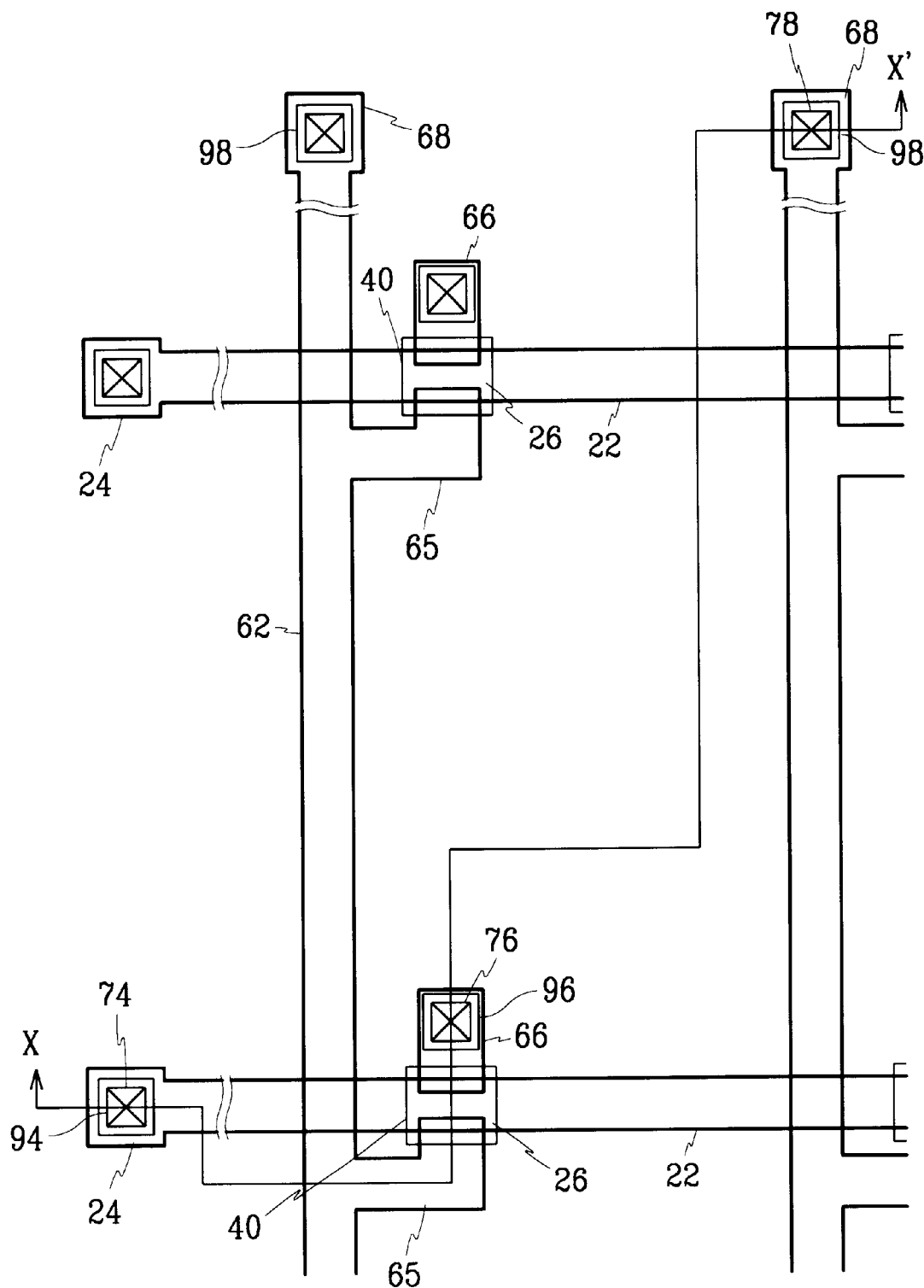
FIG. 10A is layout view of the thin film transistor array panel according to the second embodiment of the present invention at the next manufacturing step following that represented in FIG. 8A.
Figure 10B:
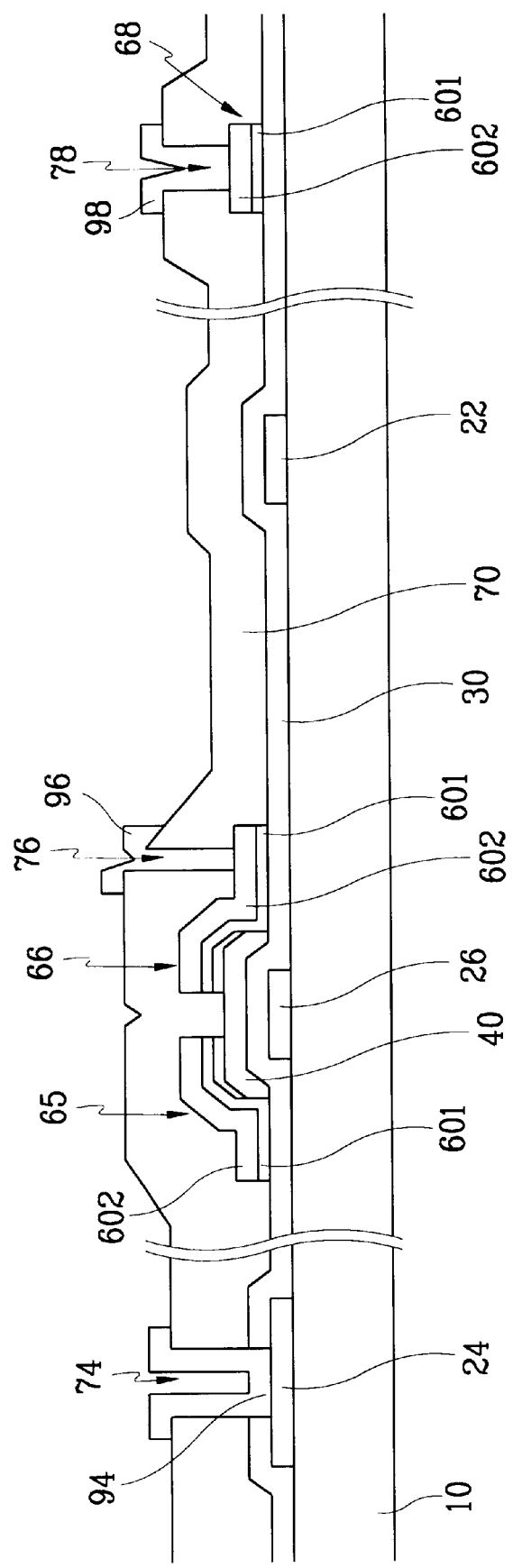
FIG. 10B is cross-sectional view taken along the line XB–XB' of FIG. 10A at the next manufacturing step following that represented in FIG. 8B.

On the other hand, in case of forming contact improvement layers 94, 96 and 98 such as the second embodiment, as shown FIGS. 10A and 10B, the transition metal layer is deposited and patterned by photolithography process using mask to form the contact improvement layers 94, 96 and 98.

Next, as shown in FIGS. 1 to 2 and 3 to 4, an IZO layer is deposited at a thickness of about 500 Å by a method such as sputtering and etched by photolithography using a mask to form a pixel electrode 82, a redundant gate pad 86 and a redundant data pad 88 electrically connected to the drain electrode 66, the gate pad 24 and the data pad 68 through the contact holes 76, 74 and 78 via the reacting or the contact improvement layers 96, 94 and 98, respectively. In this embodiment according the present invention, to minimize contact resistance of contact portion, it is preferable that the IZO layer is deposited in the range of less than 200° C., and the IZO thin film is formed through sputtering process by using the target including $In_2O_3$ and ZnO and comprising 15–20 at % (atomic percentage) of Zn. In this embodiment, IDIXO (indium x-metal oxide) produced by Idemitsu Company is used as an IZO target to form the IZO layers 82, 86 and 88.

At this time, in this manufacturing method according to the present invention, by forming the inter-layer reaction or the contact improvement layers 94, 96 and 98 between the metal layers made of aluminum-based material, and IZO before depositing the IZO layer to improve contact properties between the IZO and metal of aluminum-based material, the reliability of the contact portions may be guaranteed by minimizing contact resistance of contact portions including the pad portions and preventing from corrosion.

In the first and the second embodiments, the thin film transistor array panel is manufactured by a photolithography process using five or six photomasks, but a thin film transistor array panel may be manufactured by a photolithography process using four photomasks, and this will be described with reference to FIGS. 11 to 13.

Figure 11:
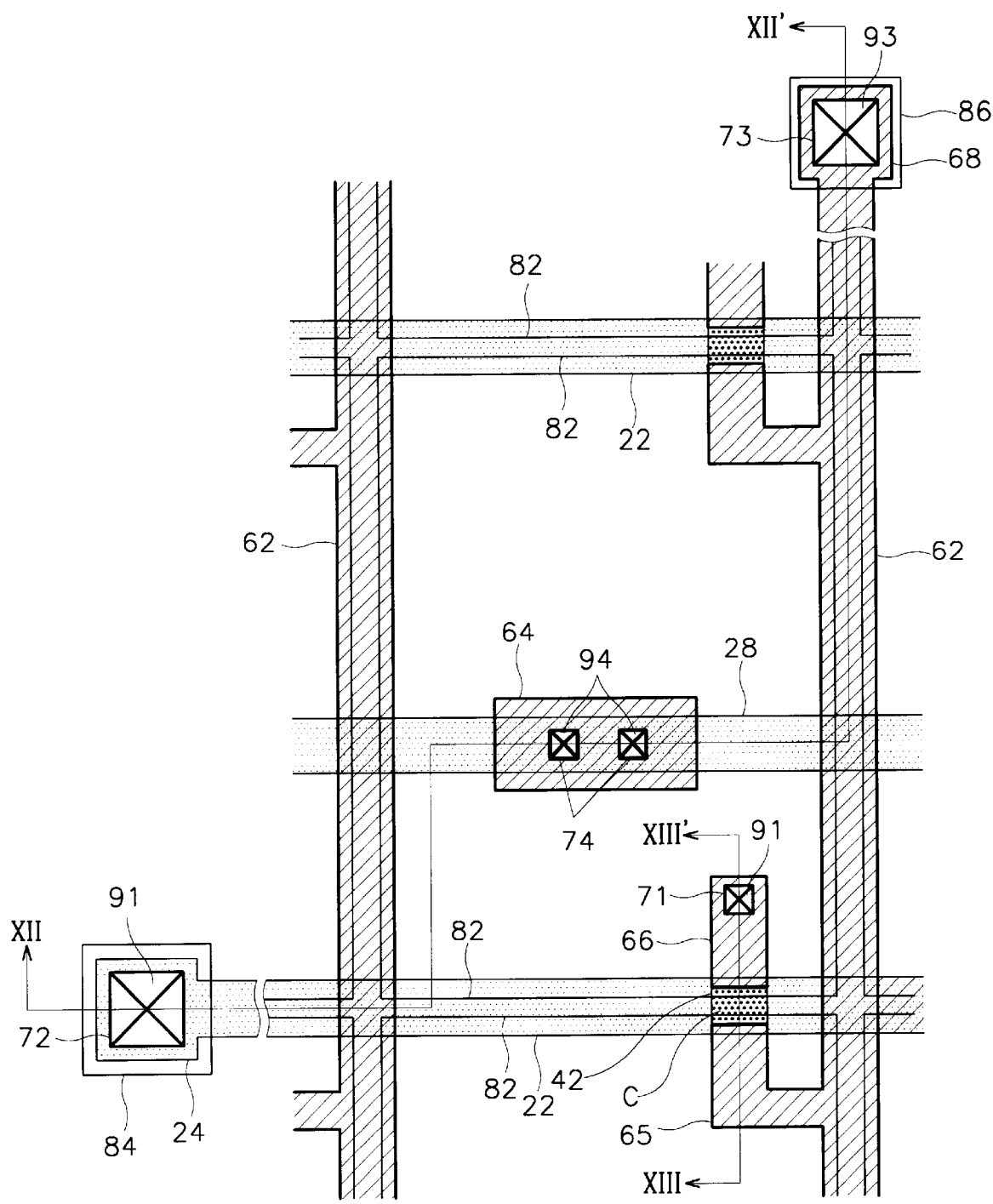
FIG. 11 is a layout view of a thin film transistor array panel for a liquid crystal display according to the third embodiment of the present invention.
Figure 12:
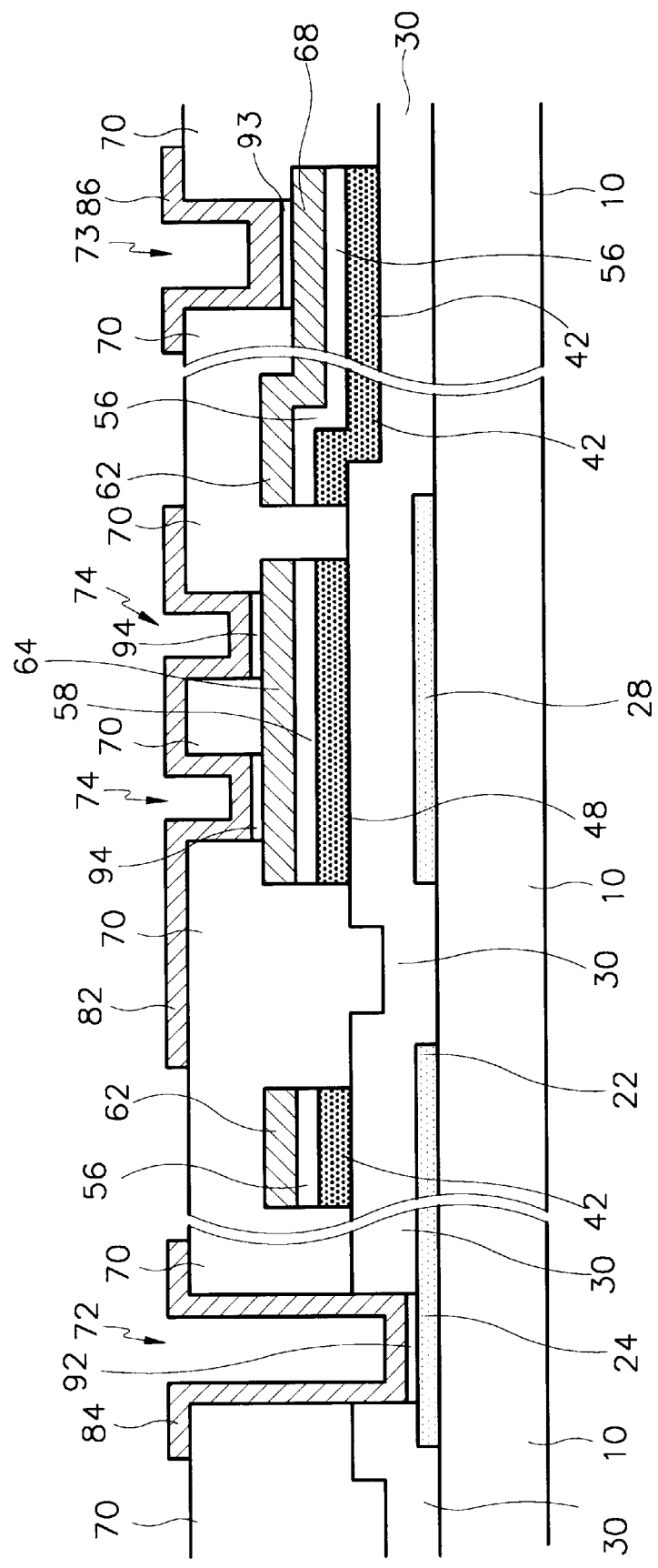
FIGS. 12 and 13 are cross-sectional views taken along lines XII–XII' and XIII–XIII' of FIG. 11, respectively.
Figure 13:
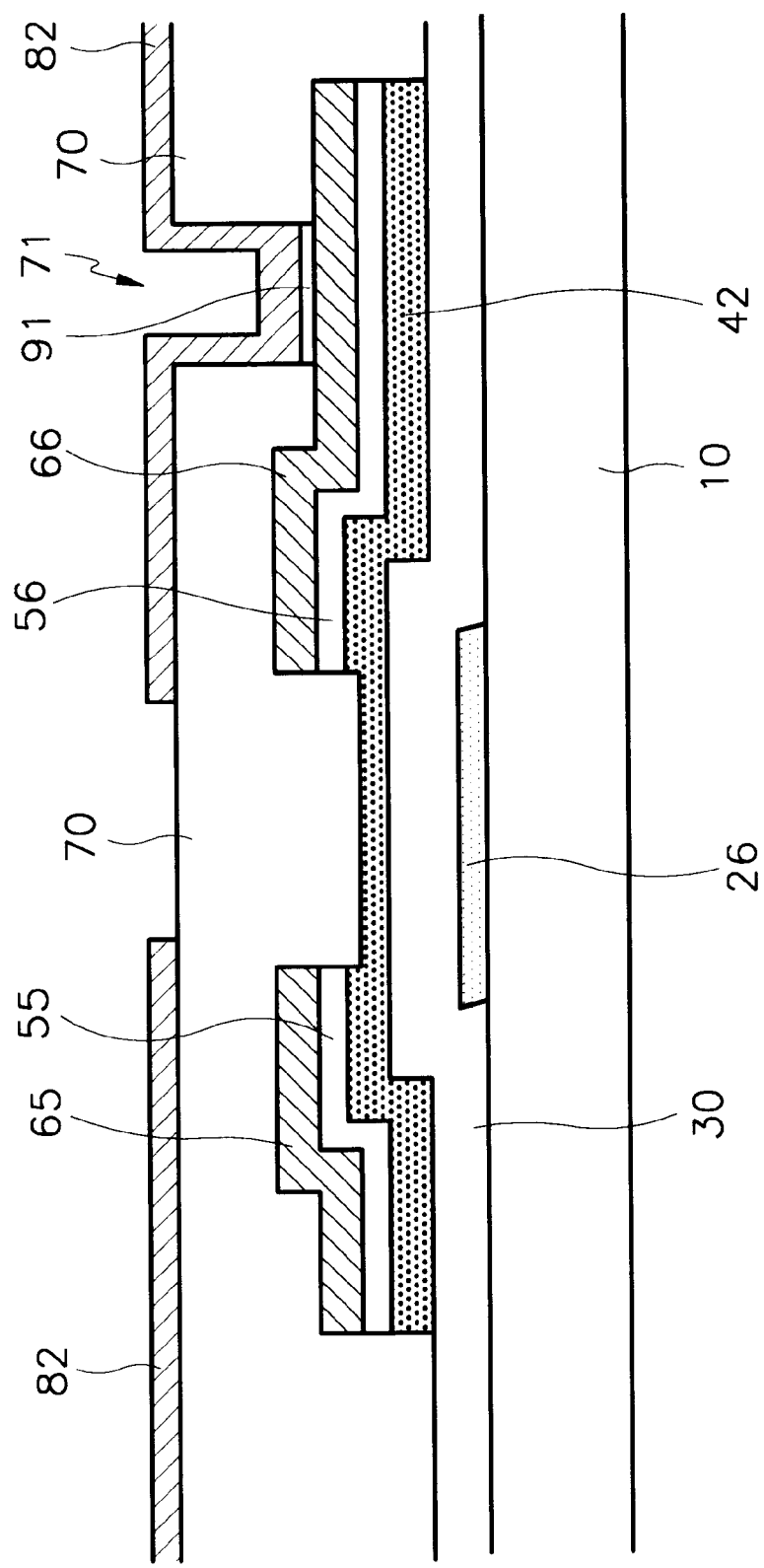

FIG. 11 is a layout view of a thin film transistor array panel for a liquid crystal display according to the third embodiment of the present invention, and FIGS. 12 and 13 are the cross-sectional views taken along lines XII–XII' and XIII–XIII' of FIG. 11.

Gate wires made of metal or conductive material such as aluminum (Al) or aluminum alloy and including a gate line 22, a gate pad 24 and a gate electrode 26, like the first embodiment, are formed on an insulating substrate 10. Also, the gate wires includes a storage electrode 28 which is formal parallel with the gate line 22 and impressed with a voltage such as a common voltage applied to a common electrode (not shown) on an upper panel of the liquid crystal display. The storage electrode 28 provides storage capacitance along with a conductor pattern 68 connected to a pixel electrode 82 that will be described later. The liquid crystal capacitor includes the pixel electrode 82 and the common electrode. The storage electrode 28 may not be provided if the storage capacitance between the pixel electrode 82 and the gate line 22 is sufficient.

Gate insulating layers 30 of silicon-nitride (SiNx) are formed on the insulating substrate 10, and covers the gate wire parts 22, 24, 26, and 28.

Semiconductor patterns 42 and 48 (made of semiconductor such as hydrogenated amorphous silicon) are formed on the gate insulating layer 30. Ohmic contact layer patterns 55, 56, and 58 (made of such materials as doped amorphous silicon heavily doped with impurities like phosphorus) are formed on the semiconductor patterns 42 and 48.

A data wire made of conductive materials such as Mo or Mo alloy, Cr, Ti and Ta is formed on the ohmic contact layer patterns 55, 56, and 58. The data wire has a data line part including a data line 62 extending in the vertical direction on FIG. 7, a data pad 68 connected to an end of data line 62 and which transmits image signs from an external circuit to the data line 62 and a source electrode 65 of a thin film transistor which is connected to data line 62. The data wire also includes a drain electrode 66 of the thin film transistor on the other side of the gate electrode 26 or the channel part C of a thin film transistor and is separated from the data line parts 62, 64, 65, and conductor pattern 64 used for storage capacitance located on the storage electrode 28. When the storage electrode 28 is not provided, neither is the conductor pattern 64.

The data wire parts 62, 64, 65, 66, and 68 may have a single-layered structure made of a metal of aluminum-based material, as the gate wire 22, 24, 26 and 28, but the data wire may have a double-layered structure including one layer made of a material such aluminum or aluminum alloy and another layer made of a material such as Mo or Mo alloy, Cr, Ti and Ta.

The ohmic contact layer patterns 55, 56, and 58 play a roll to reduce the contact resistance between the semiconductor patterns 42 and 48 and the corresponding data wire parts 62, 64, 65, 66, and 68, and have the same layout as the data wire parts 62, 64, 65, 66, and 68. In other word, a first ohmic contact layer portion 55 under the data line part has the same shape as the data line parts 62, 68, and 65, a second ohmic contact layer portion 56 under the drain electrode part has the same shape as the drain electrode 66, and a third ohmic contact layer portion 58 under the conductor pattern 64 has the same shape as the conductor pattern 64 for the storage capacitor.

The semiconductor patterns 42 and 48 except for the channel part C of the thin film transistor have the same layout as the corresponding data wire parts 62, 64, 65, 66, and 68 and the corresponding ohmic contact layer patterns 55, 56, and 58. Or, more concretely, the semiconductor portion 48, the conductor pattern 64, and the third ohmic contact layer portion 58 all have the same shape, but the semiconductor portion 42 has a different shape from the data wire and the ohmic contact layer pattern. In other words, the data line parts 62, 68, and 65, especially the source electrode 65 and the drain electrode 66, are separated from each other by the channel part C of thin film transistor and the portions 55 and 56 of ohmic contact layer pattern thereunder are also separated from each other, but the semiconductor portion 42 is not divided into two pieces so that it traverses the channel of a thin film transistor.

A passivation layer 70 made of organic insulator such as silicon-nitride is formed on the data wire parts 62, 64, 65, 66, and 68.

The passivation layer 70 have contact holes 76, 78 and 72 respectively exposing the drain electrode 66, the gate pad 24, the data pad 68 and the conductor pattern 64 provided for storage capacitance, and a contact hole 74 exposing the inter-layer reaction layer 91 on the gate pad 24 along with the gate insulating layer 30.

Inter-layer reaction layers 91, 92, 93 and 94, which include at least $Al_xSi_x$ made of aluminum and silicon, or inter-metallic compound, are at least formed on the portion of the drain electrode 66, the gate pad 24, the data pad 68 and the conductor pattern 64, which are exposed through contact holes 71, 72, 73 and 74.

Pixel electrodes 82 that receive an image signal and generate an electric field with a common electrode of an upper panel are formed on the passivation layer. The pixel electrode 82 is made of a transparent conductive material such as indium zinc oxide (IZO). The pixel electrode 82 is connected to the inter-layer reaction layer 91 on the drain electrode 66 both physically and electrically through the contact hole 71, and receives the image signal from the drain electrode 66. Even though the aperture ratio is increased when the pixel electrode 82 overlaps the gate lines 22 or the adjacent the data lines 62, these lines are not required to overlap the pixel electrode. The pixel electrode 82 is connected to the conductor pattern 64 for storage capacitance through the contact hole 74 and transmits an image signal to the conductor pattern 64.

A redundant gate pad 84 and a redundant data pad 86 respectively connected to inter-layer reaction layers 92 and 93 on the gate pad 24 and the data pad 68 through the contact holes 72 and 73 are formed on the gate pad 24 and the data pad 68. These redundant pads 84 and 86 are optional as they protect the pads 24 and 68 and supplement the adhesiveness between an external circuit and the pads 24 and 68.

In this embodiment, transparent IZO is taken as an example of the material of the pixel electrode 82, but a transparent-conductive material made of polymer may also be used, and an opaque-conductive material may also be used in a reflective type liquid crystal display.

A manufacturing method of a thin film transistor array panel according to an embodiment of the present invention will now be described with reference to the FIGS. 14A to 21C and FIGS. 11 to 13.

Figure 14A:
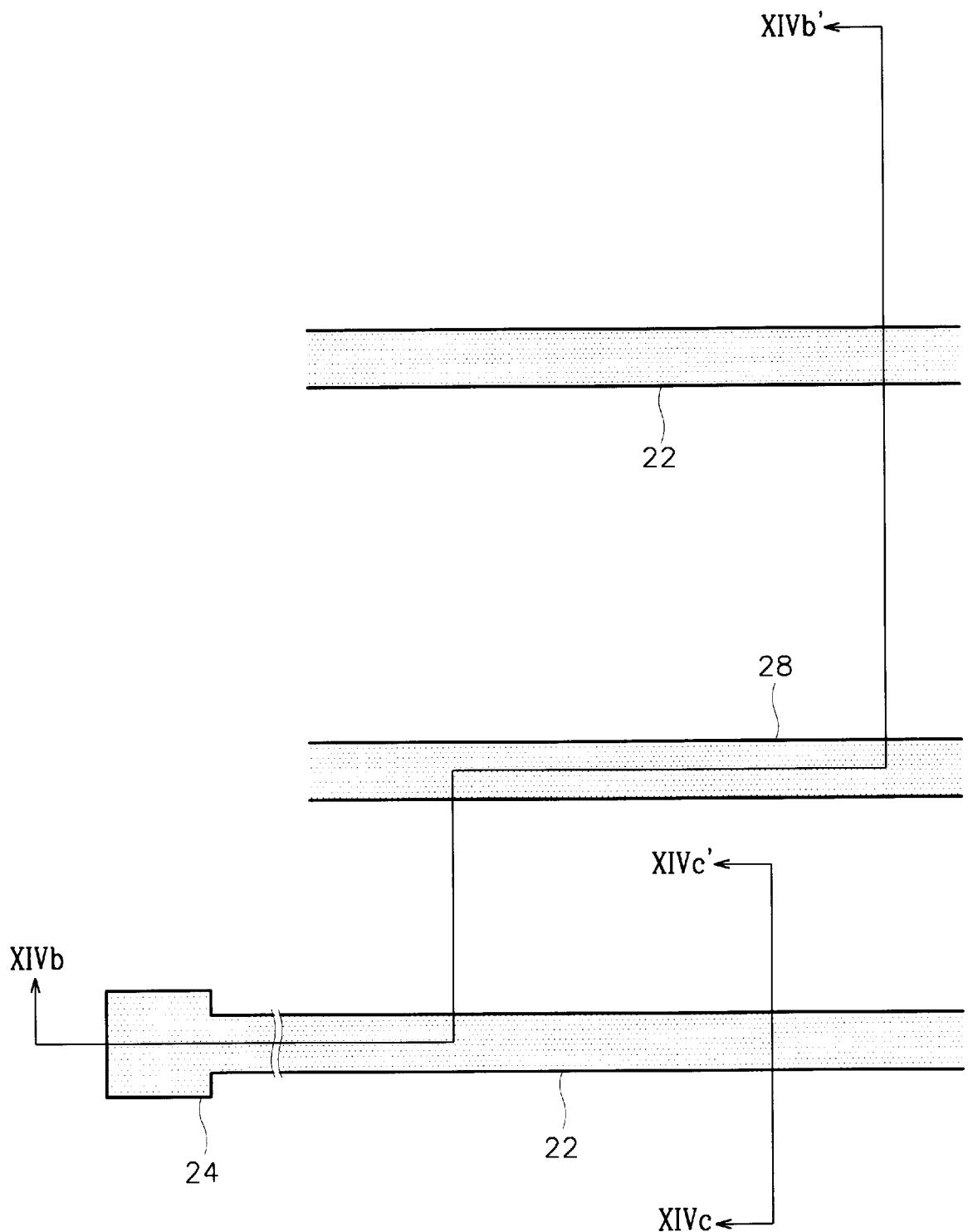
FIG. 14A is a layout view of the thin film transistor array panel according to the third embodiment of the present invention at a first manufacturing step of a manufacturing method.
Figure 14B:
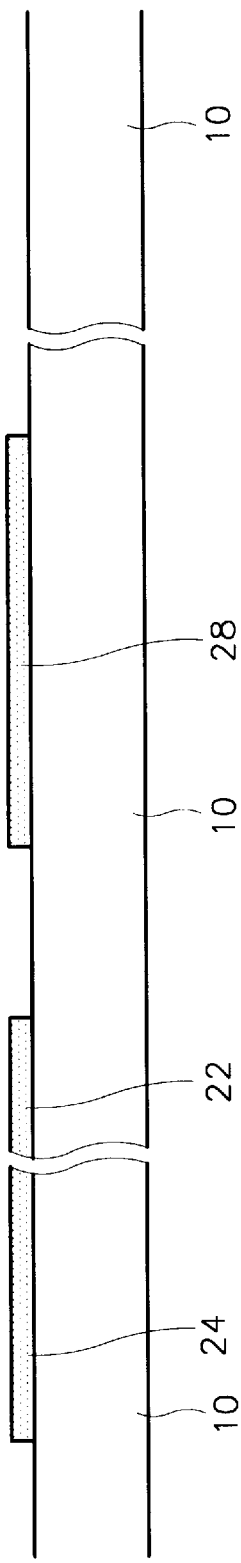
FIGS. 14B and 14C are cross-sectional views taken along the lines XIVB–XIVB' and XIVC–XIVC' of FIG. 14A.
Figure 14C:
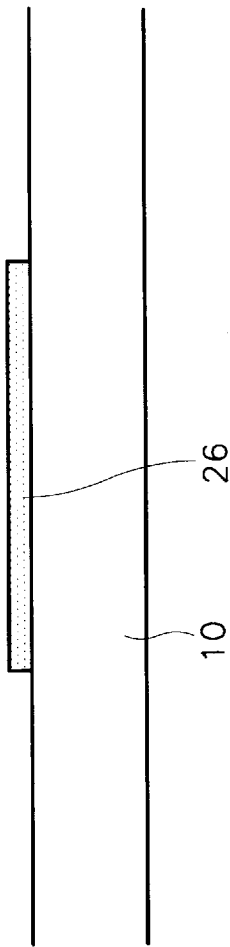

At first, as shown in FIGS. 14A to 14C, a conductive layer having low resistivity such as aluminum or aluminum alloy is deposited and patterned, such as the first embodiment. Preferably, in this embodiment, a target of Al—Nd alloy including 2 at % (atomic percentage) of Nd was sputtered at a temperature of about 150° C. to form the conductive layer at a thickness of about 2,500 Å on the substrate 10, then the conductive layer is patterned to form gate wire parts including a gate line 22, a gate electrode 26, a gate pad 24, and a storage electrode 28 by dry or wet etching the conductive layer through a photolithography process using a first mask.

Figure 15A:
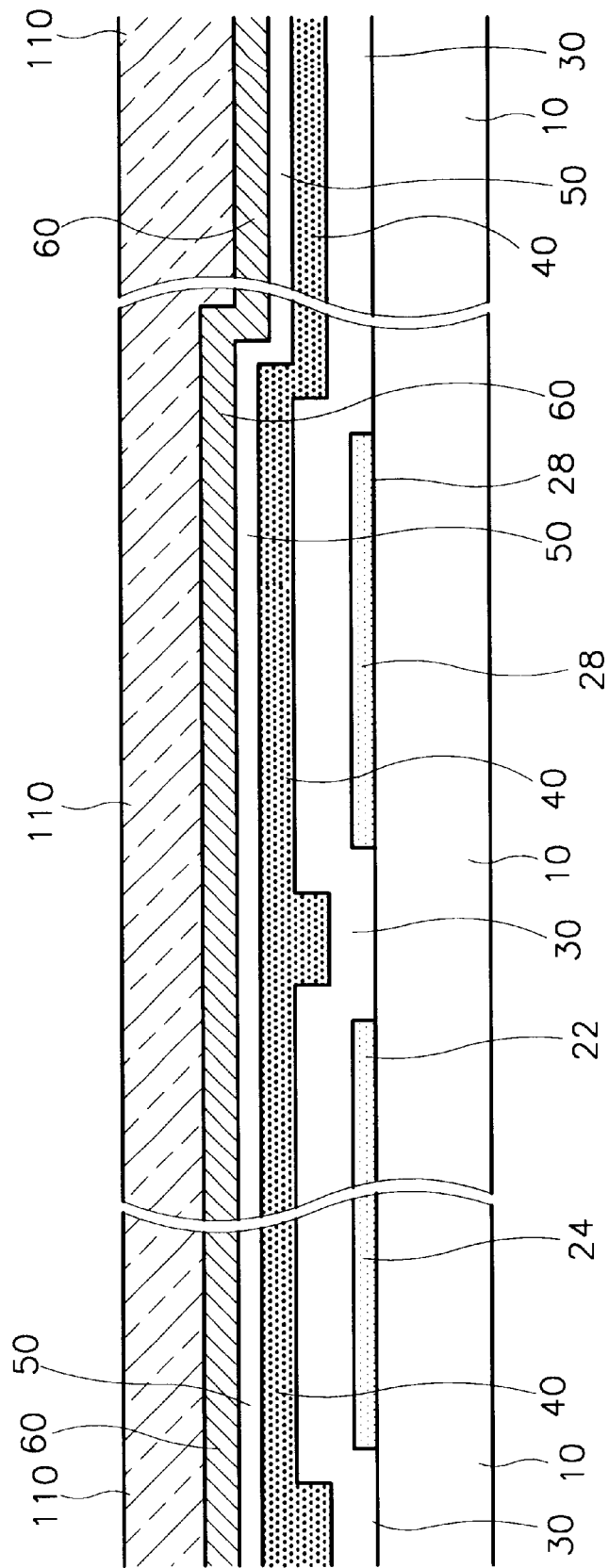
FIGS. 15A and 15B are cross-sectional views at the next manufacturing step following that represented in FIGS. 14B and 14C taken along the lines XIVB–XIVB' and XIVC–XIVC' of FIG. 14A.
Figure 15B:
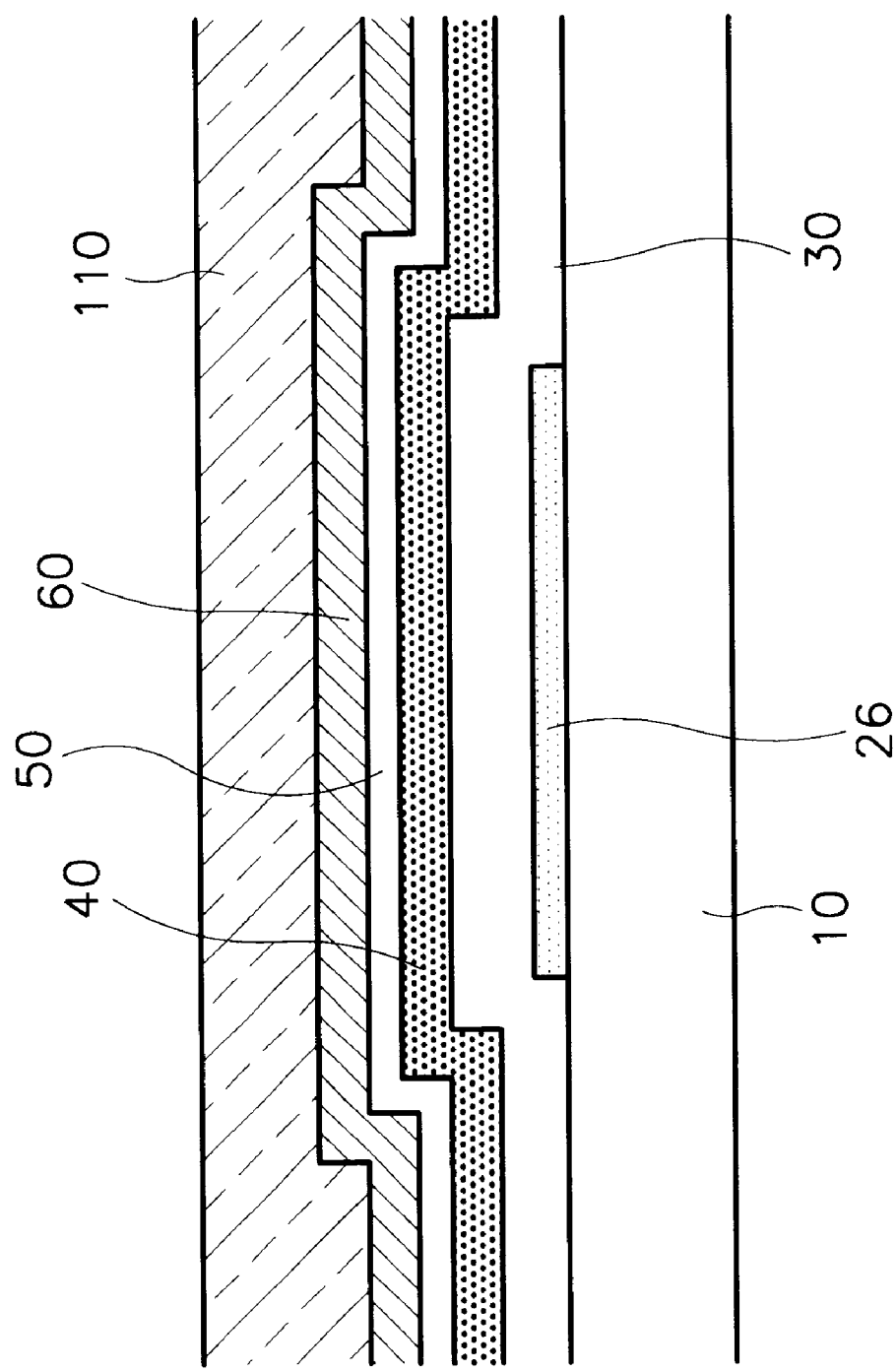

Next, as shown in FIGS. 15A and 15B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering and a photoresist layer 110 having a thickness of 1 ㎛ to 2 ㎛ is coated on the conductive layer 60.

Figure 16A:
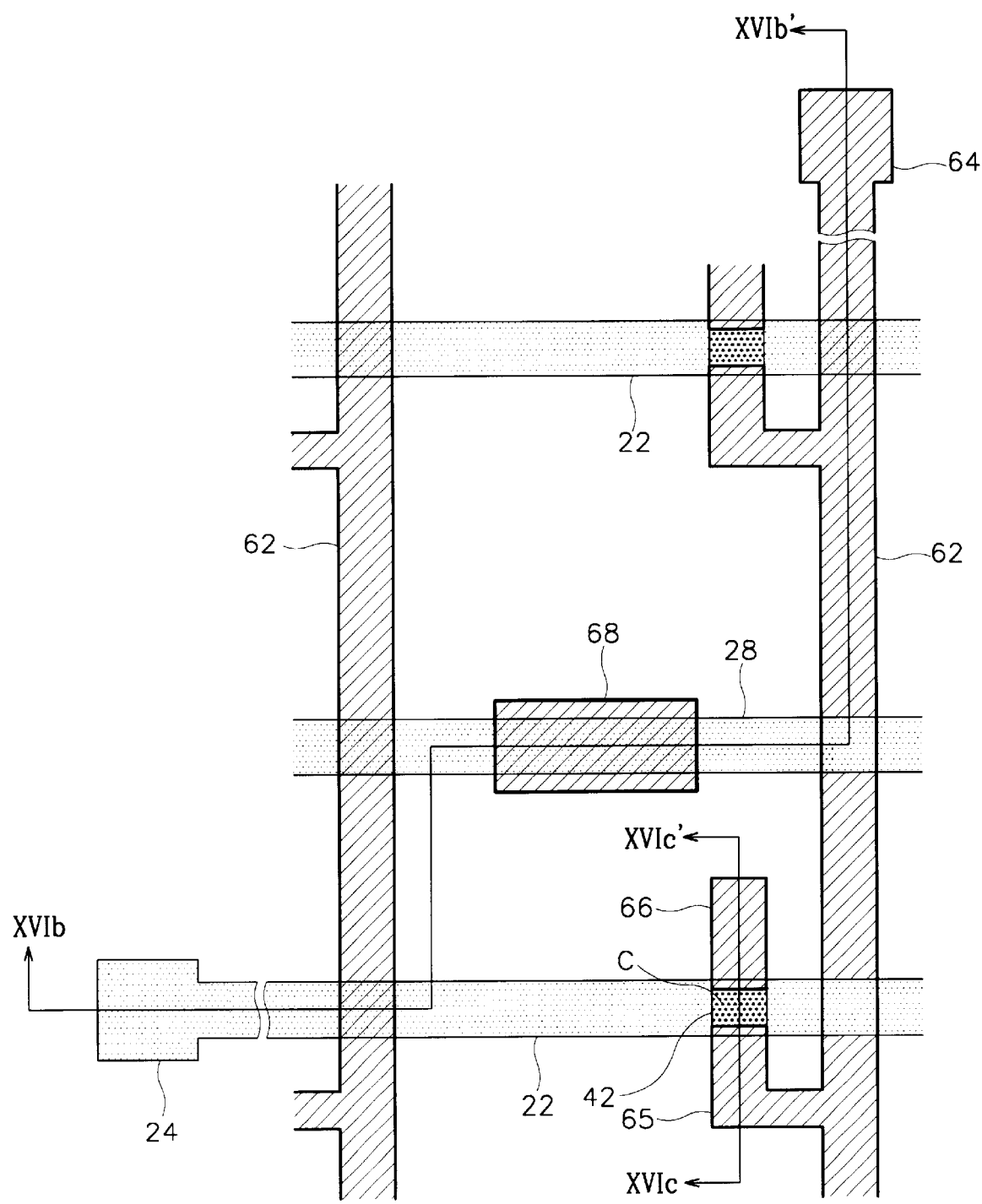
FIG. 16A is a layout view of thin film transistor array panel in the next manufacturing step following that represented in FIGS. 15A and 15B.
Figure 16B:
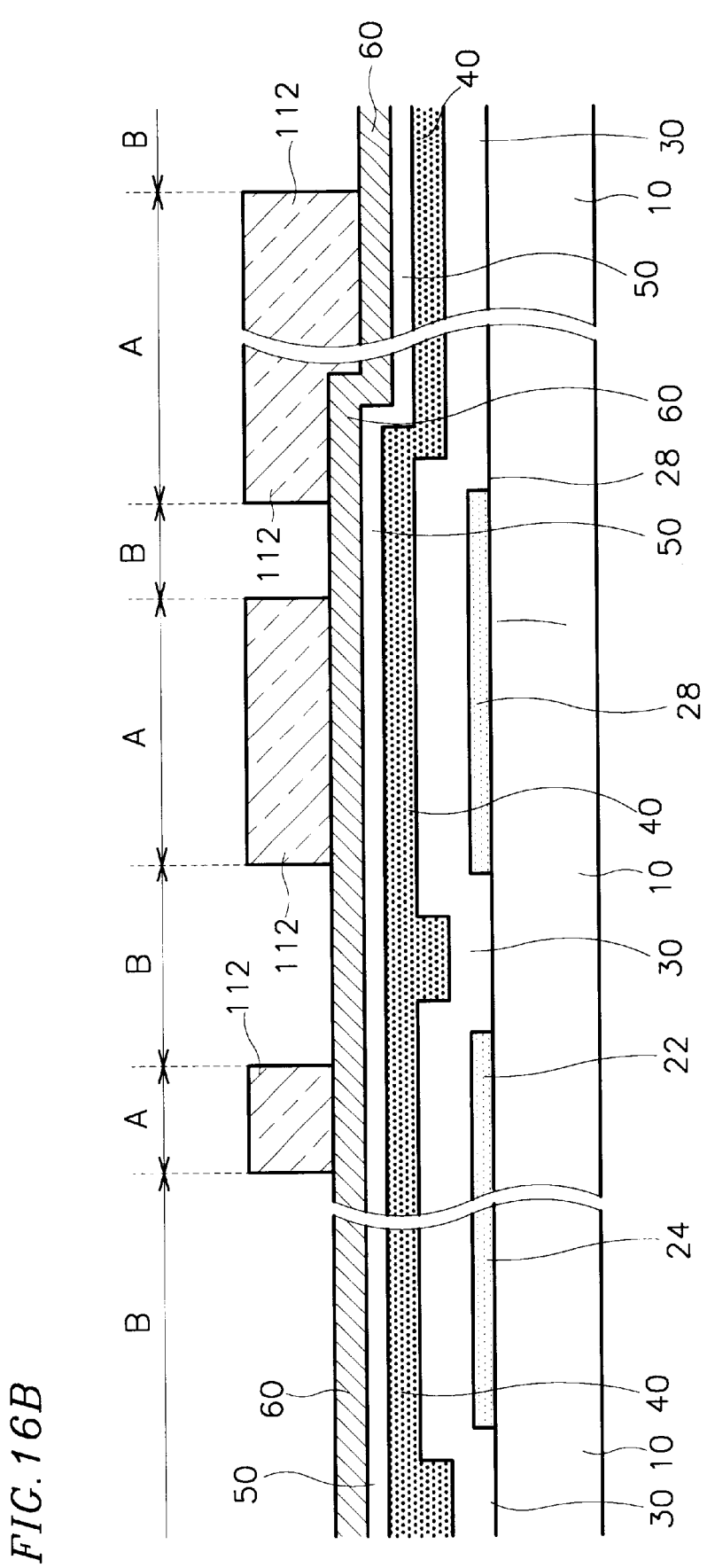
FIGS. 16B and 16C are respectively cross-sectional views taken along the lines XVIB–XVIB' and XVIC–XIVC' of FIG. 16A.
Figure 16C:
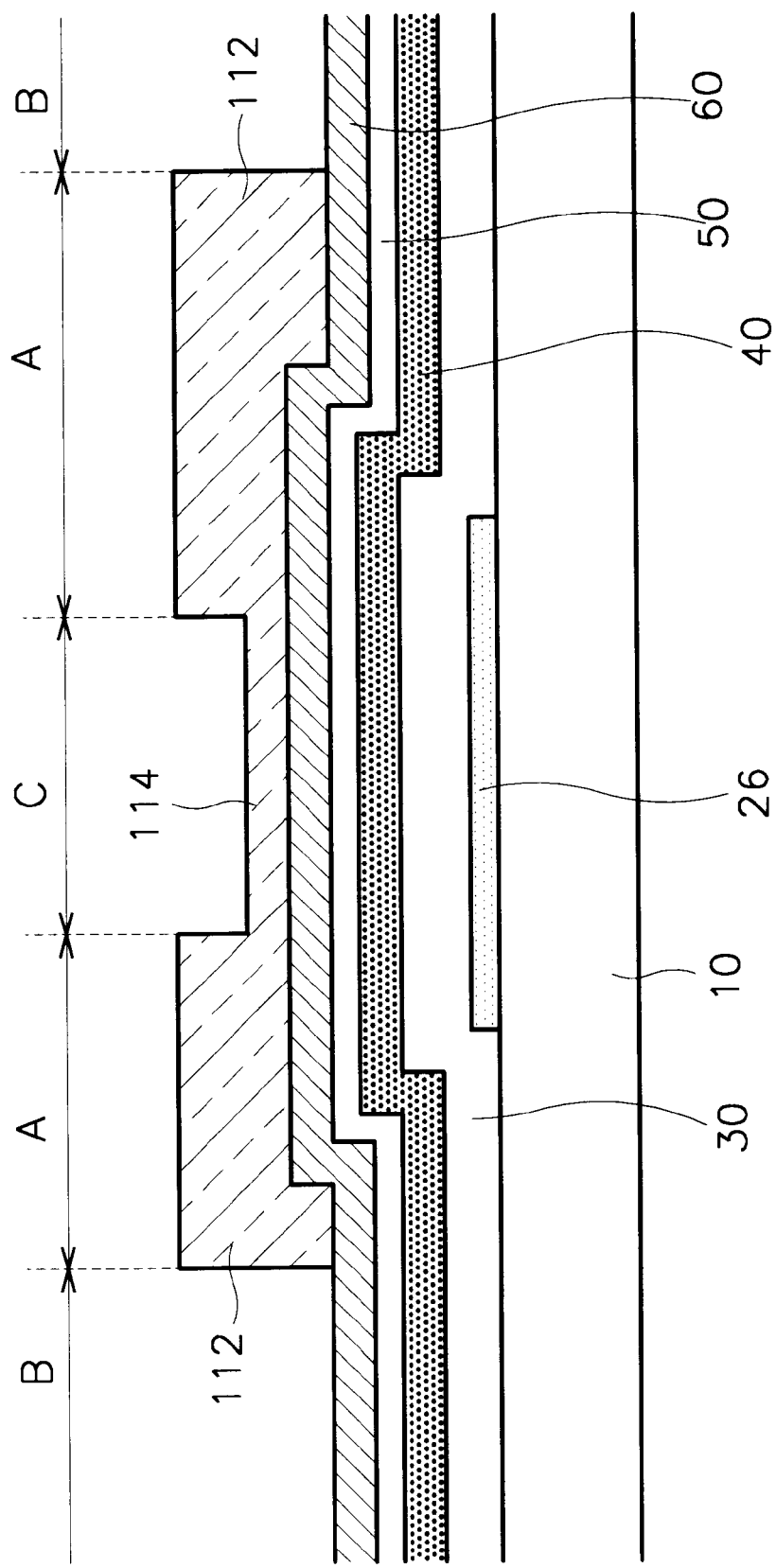

Thereafter, the photoresist layer 110 is exposed to light through a second mask and developed to form photoresist patterns 112 and 114 as shown in FIGS. 16B and 16C. At this time, the first portion 114 of the photoresist pattern located between a source electrode 65 and a drain electrode 66, i.e., a thin film transistor channel part C as shown in FIG. 16C, is thinner than the second portion 112 of photoresist pattern located over the data wire portion A where a data wire parts 62, 64, 65, 66, and 68 will be formed. Additionally, the third portion, or the remaining portion of the photoresist pattern located at portion B, is thinner than the first portion. The third portion may have a thickness that varies according to the etching method. For example, the third portion has substantially zero thickness when using a wet etch, but the third portion may have a non-zero thickness when using a dry etch. At this time, the thickness ratio between the first portion 114 and the second portion 112 depends on the etch conditions which will be described later. However, it is preferable that the thickness of the first portion 114 is equal to or less than half of that of the second portion 112, or for example, less than 4,000 Å.

There are many methods to vary the thickness of the photoresist layer according to position, and it is possible to control the amount of incident light of a portion by forming a pattern such as a slit or a lattice, or by providing a partly-transparent layer on the mask.

At this time, it is desirable that the size of the slit and the opaque portion between the slits are smaller than the resolution of the exposure device. When a partly-transparent layer is used, to reduce the amount of exposing light, a mask including films having different transmittances, or having a various thickness may be used.

When the photoresist layer is exposed to light through this mask, the polymers of the photoresist layer are disintegrated by the light. The exposure step is finished when the polymers of a portion, which is directly exposed to the light, are completely disintegrated. However, the polymers of the photoresist layer portion, which are exposed through the slits pattern, or partly-transparent layer are not completely disintegrated because the amount of incident light is less than that of the directly exposed portion. The polymers of the photoresist layer portion, which are not exposed to light by blocking layer, are hardly disintegrated. After developing the photoresist layers, the photoresist layer portion, which is hardly disintegrated, is nearly remained, and a thinner portion is remained under the portion, which was exposed to a lesser amount of light than the portion, which received full exposure. However, if the exposure time is too long, all the polymers of the photoresist layer are disintegrated. Therefore, such over exposure should be avoided.

The thinner portion 114 may be formed by forming a photoresist layer made of photosensitive and reflowable material, exposing the photoresist layer to light through a mask having respectively substantially transparent portions and substantially opaque portions to form a photoresist pattern having portions of zero and nonzero thicknesses, and reflowing the photoresist to flow into the zero thickness portions to form a new photoresist pattern.

Referring back to FIG. 16C, the photoresist pattern 114 and the layers thereunder including the conductor layer 60, the ohmic contact layer 50, and the semiconductor layer 40 are next subjected to an etching process. When this is done, a data wire and the layers thereunder at the data wire part A may be left, as well as only the semiconductor layer on the channel part C. In addition, three layers 60, 50, and 40 in the remaining part B are removed from the gate insulating layer 30.

As shown in FIGS. 17A and 17B, the ohmic contact layer 50 of the part B is exposed by removing the conductor layer 60 thereon. At this time, both wet and dry etch can be used, and it is preferable that the etch is performed under a condition such that the conductor layer 60 is etched but the photoresist layers 112 and 114 are not etched. However, since it is hard achieve this in the case of a dry etch, the etch may be performed under a condition that the photoresist patterns 112 and 114 is also etched. In this case, the first portion 114 may be made thicker than in the wet etch case so that the conductor layer 60 is not exposed.

If the conductor layer 60 is made of Mo or MoW alloy, Al or Al alloy, or Ta, both dry or wet etch methods can be used. However, if the conductor layer 60 is made of Cr, a wet etch is better because Cr is not easily removed by dry etch. CeNHO$_3$ is available as a wet etchant for etching a Cr conductor layer 60. The mixed gas system systems of CF$_4$ and HCl or CF$_4$ and O$_2$ is available for dry etching a Mo or MoW conductor layer 60, and in this case, the etch rate of the latter system on the photoresist layer is similar to that of the conductor layer 60.

Referring to FIGS. 17A and 17B, as a result, only the portions of the conductor 67 and 64 under the photoresist layers 112 and 114 at the channel part C and the data wire part B for source/drain electrodes and a storage capacitor are left, and the remaining portion of the conductor layer 60 at part B is wholly removed to expose the ohmic contact layer 50 thereunder. At this time, the conductor patterns 67 and 64 have the same layout as the data wire parts 62, 64, 65, 66, and 68 except that the source electrode 65 and the drain electrode 66 are connected to each other. When a dry etch is used, the photoresist layers 112 and 114 are also etched to a certain thickness.

Figure 18A:
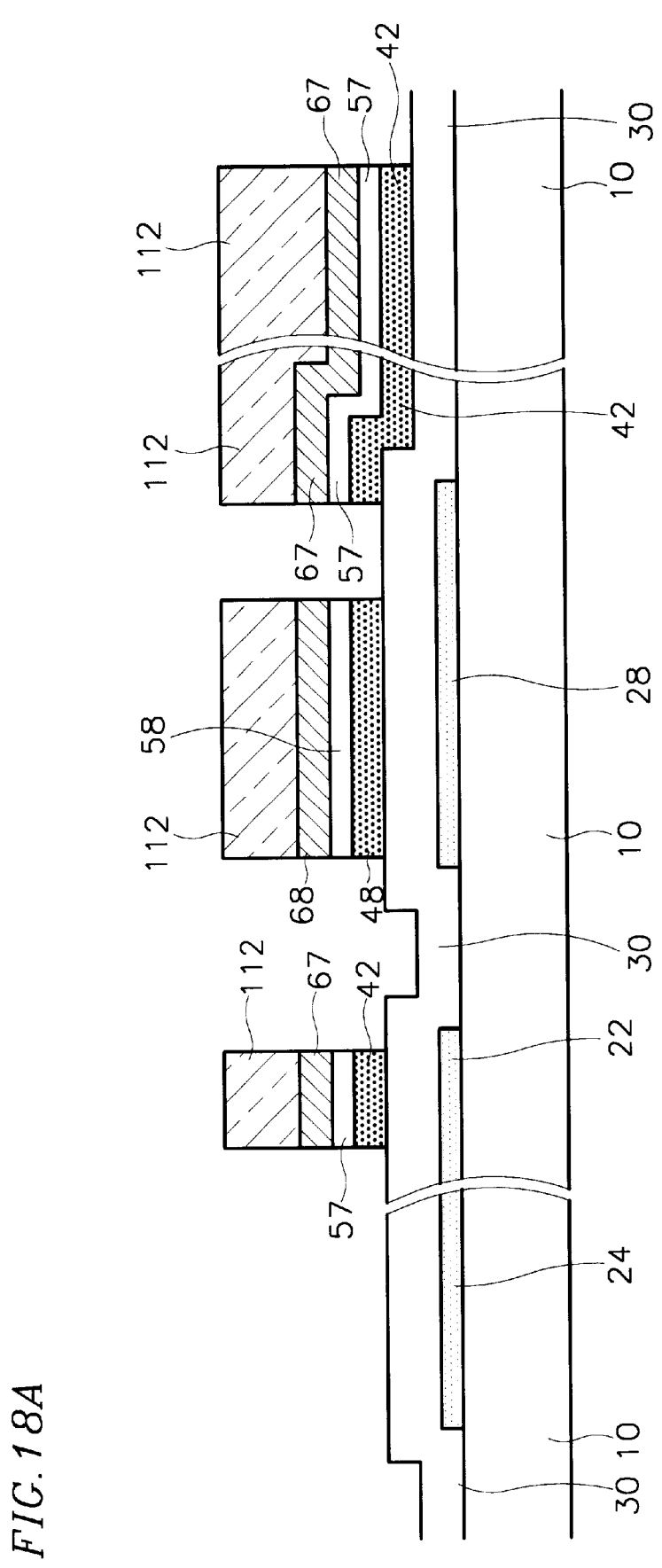
Figure 19A:
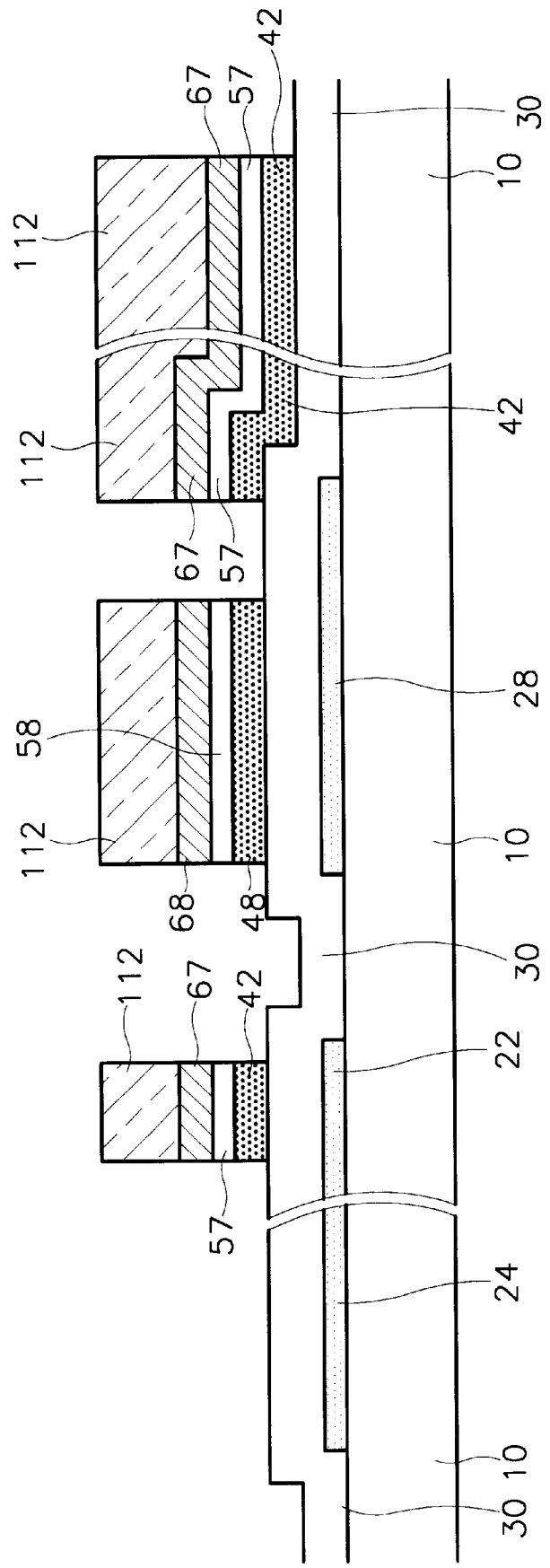
Figure 19B:
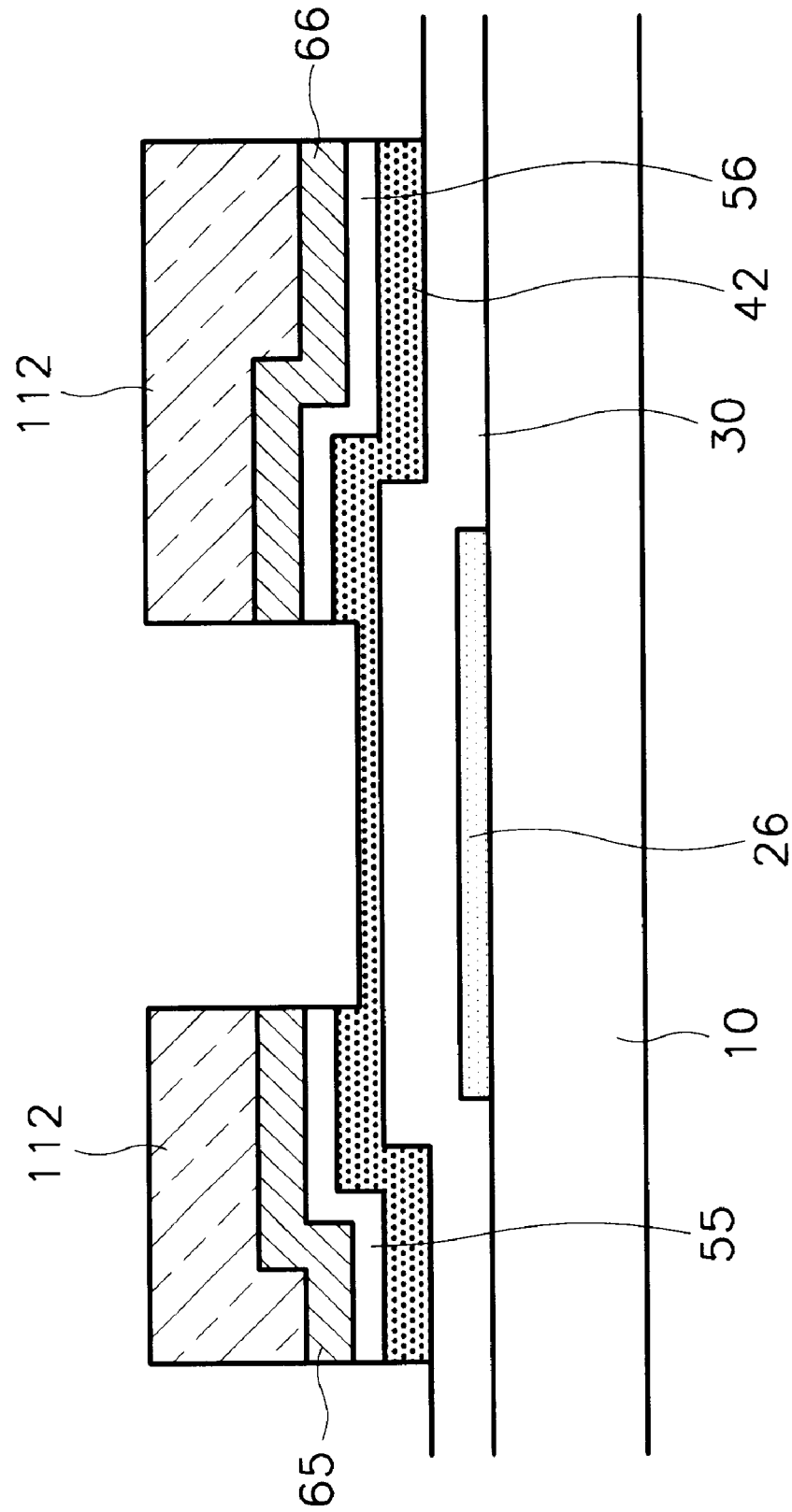

Next, the exposed portions of the ohmic conductor layer 50 at part B, and the semiconductor layer 40 thereunder of FIGS. 14A and 14B are removed by dry etching along with first portion 114 of the photoresist layer, as shown FIGS. 18A and 18B. The etch condition may be such that the photoresist patterns 112 and 114, the ohmic contact layer 50 and the semiconductor layer 40 are all etched (the semiconductor layer and the ohmic contact layer have almost the same etch rate), but the gate insulating layer 30 must be not etched. It is preferable that the etch rates of the photoresist patterns 112 and 114 and the semiconductor layer 40 are almost the same. This occurs, for example, with the mixed gas systems of $SF_6$ and HCl or $SF_6$ and $O_2$. At this time, if the etch rates of the photoresist patterns 112 and 114, the semiconductor layer 40 are almost the same, the thickness of the first portion 114 is equal to or less than that of the sum of the semiconductor layer 40, and the ohmic contact layer 50.

Then, as shown in FIGS. 18A and 18B, the conductor pattern 67 is exposed by removing the first portion 114 of the channel part C, and the gate insulating layer 30 are exposed by removing the ohmic contact layer 50, and the semiconductor layer 40 of the part B shown in FIG. 18B. At the same time, the thickness of the second portion 112 over the data wire part A is reduced by etching. Furthermore, the completed semiconductor patterns 42 and 48 are obtained at this step. The reference numerals 57 and 58 respectively represent the ohmic contact layer pattern under the conductor patterns 67 and 64 for the source/drain the electrode and the storage capacitor.

The remaining photoresist layer on the conductor pattern 67 is then removed by ashing or plasma etching.

Next, as shown in 19A and 19B, the conductor pattern 67 for source/drain electrodes at the channel part C and the ohmic contact layer pattern 57 for source/drain electrodes of FIG. 14B are removed by etching. At this time, it is possible either to etch both the conductor pattern 67 and the ohmic contact layer 57 by a dry etching method, or to etch the conductor pattern 67 by a wet etching method and the ohmic contact layer 57 by a dry etching method. It is preferable in the former case that etch conditions having large etch selectivity between the conductor pattern 67 and the ohmic contact layer pattern 57 are employed. This is because if the etch selectivity is not large enough, it is hard to detect the end point of the etch and to control the thickness of the semiconductor pattern 42 around the channel part C. This can be achieved by using a mixed gas system of $SF_6$ and $O_2$, for example. In the latter case of doing the wet etch and the dry etch sequentially, the lateral sides of the conductor pattern 67 subjected to wet etch are also etched although those of the ohmic contact layer pattern 57, which is dry etched, are hardly etched at all. Thereby, the profile of these two patterns 67 and 57 makes a step like form. The mixed gas systems of $CF_4$ and $O_2$, or $CF_4$ and HCl are examples of an etch gas system for etching the ohmic contact layer pattern 57 and the semiconductor pattern 42. The semiconductor pattern 42 may also be formed to have a uniform thickness by etching with the mixed gas system of $CF_4$ and $O_2$. At this time, as shown in FIG. 15B, the thickness of the semiconductor pattern 42 may be reduced and the second portion 112 of the photoresist pattern is also etched to a certain thickness. The etch conditions may also be set not to etch the gate insulating layer 30, and it is preferable to make the photoresist pattern thick enough not to expose the data wire parts 62, 64, 65, 66, and 68.

As a result, the source electrode 65 and the drain electrode 66 are divided, and the completed data wire parts 62, 64, 65, 66, and 68 and the completed contact layer pattern 55, 56, and 58 thereunder are obtained.

Next, the remaining second portion 112 of the photoresist layer on the data wire (Region A of FIG. 13C) is removed. However, this removal of the second portion 112 may be performed after the step removing the conductor pattern 67 for source/drain electrodes on the channel part C of FIG. 15B and before the step removing of the ohmic contact layer pattern 57 under the conductor pattern 67.

To summarize, this process can be done by using both wet etching and dry etching in turn, or by using only dry etching.

In the former case, the conductor layer of the part B is first remove by wet etching, and then the ohmic contact layer and the semiconductor layer thereunder are removed by dry etching. At this time, the photoresist layer of the part C is consumed to a certain thickness, and the part C may have or may not have any residual photoresist left, which substantially depends on the initial thickness of the photoresist layer of the part C. When the part C has residual photoresist left, this residual photoresist is removed by ashing. Finally, the conductor layer of the part C is wet etched to separate the source and the drain electrodes, and the ohmic contact layer of the part C is removed by using dry etching.

In the latter case, the conductor layer, the ohmic contact layer, and the semiconductor layer of the part B are removed by dry etching. As in the former case, the part C may have or may not have residual photoresist left, and residual photoresist is removed by ashing when part C does have any residual photoresist. Finally, the conductor layer of the part C is dry etched to separate the source and the drain electrodes, and the ohmic contact layer of the part C is removed by using dry etching.

Also, if the data wire is etched, the semiconductor pattern, the contact layer pattern, and the data wire may be completed with the same step at one time. That is to say, it is desirable that the photoresist pattern 114 and the contact layer 50 thereunder of the part C are dry etched, and the portion of the photoresist pattern 112 of the part A is dry etched during the dry etching of the conductor layer, the ohmic contact layer, and the semiconductor layer of the part B.

Since the latter process uses only one type of etching method, it is simpler, although it is harder to achieve proper etching conditions. On the other hand, the former process has the advantage of ease of achieving proper etching condition, although it is more complicated.

Figure 20A:
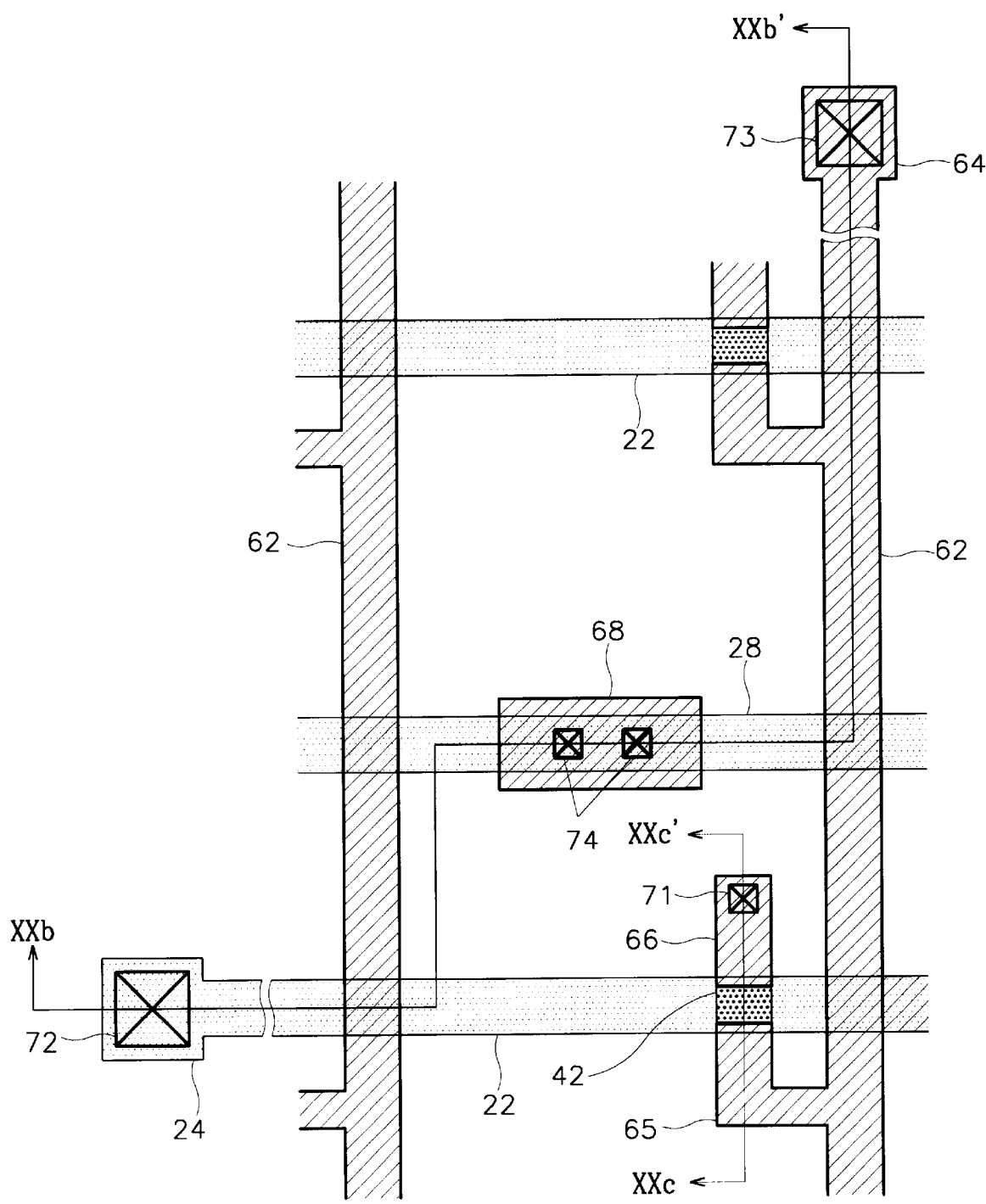
FIG. 20A is a layout view of thin film transistor array panel in the next manufacturing step following that represented in FIGS. 19A and 19B.
Figure 20B:
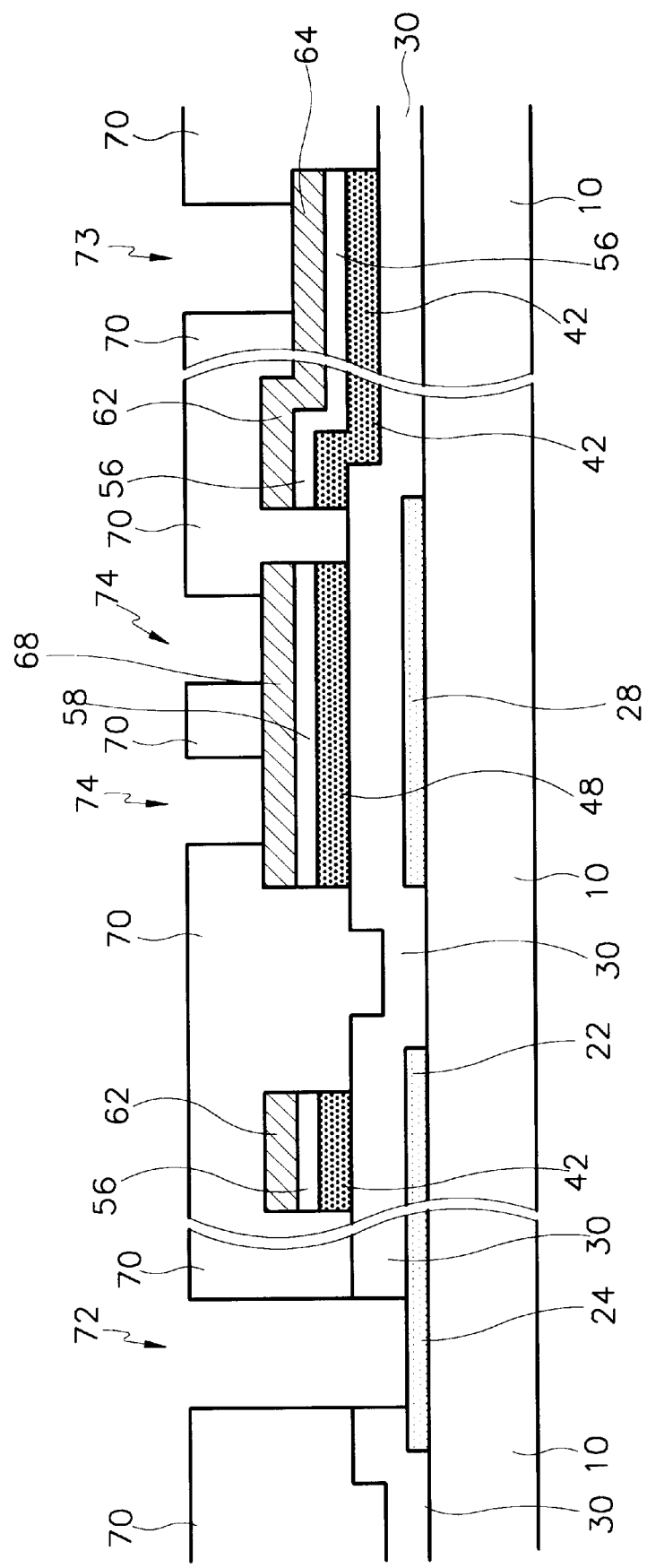
FIGS. 20B and 20C are the cross-sectional views taken along the lines XXB–XXB' and XXC–XXC' of FIG. 20A, respectively.
Figure 20C:
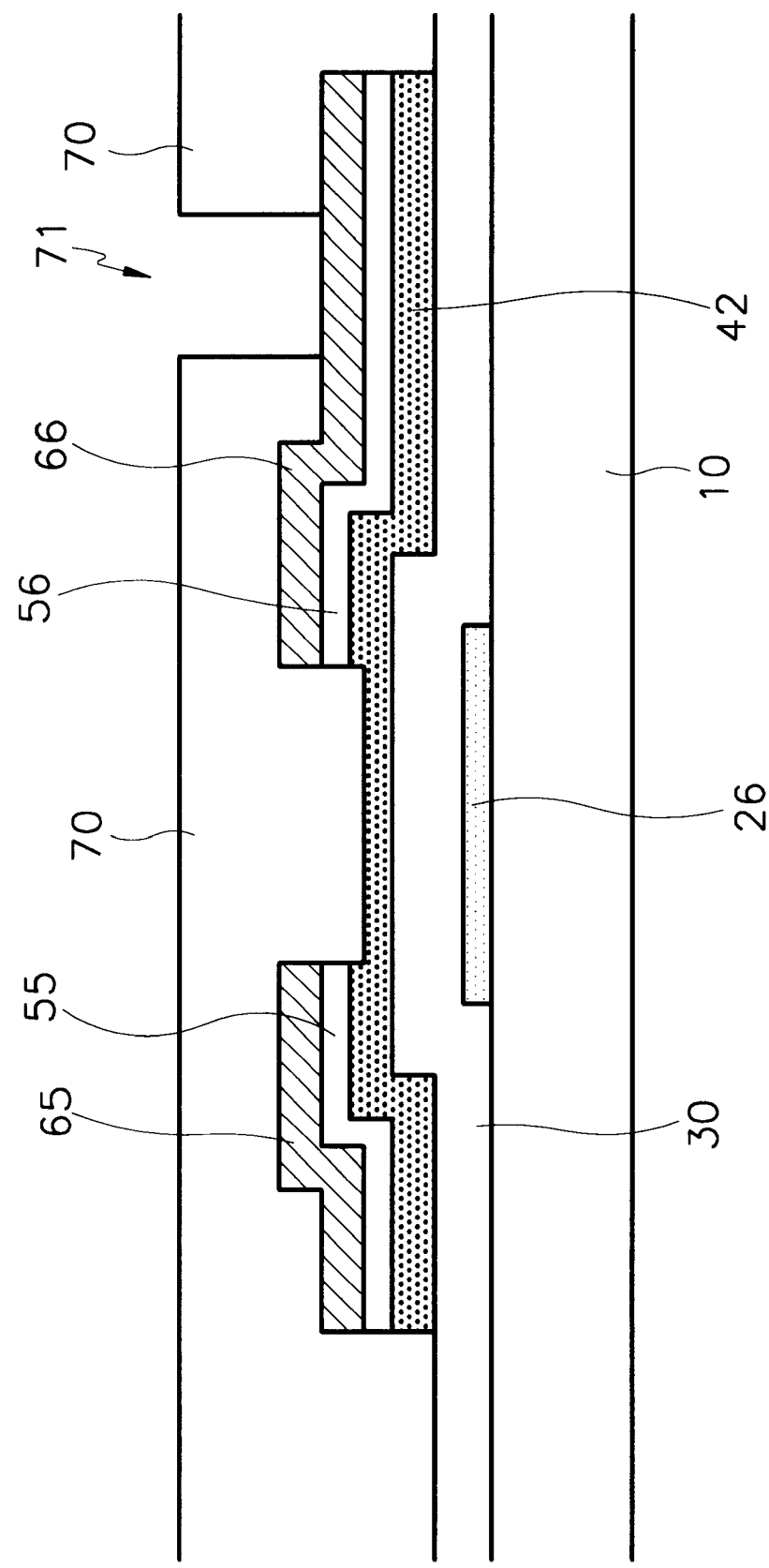

After forming data wire parts 62, 64, 65, 66, and 68 by the above steps, a passivation layer 70 having the thickness of over 3,000 Å is formed by CVD of SiNx or spin coating of organic insulator, as shown in FIGS. 20A to 20C. Then, contact holes 71, 72, 73, and 74 respectively exposing the drain electrode 66, the gate pad 24, the data pad 68, and the conductor pattern 64 for the storage capacitor are formed by etching the passivation layer 70 and the gate insulating layer 30 at the same time by using the third mask.

Figure 21A:
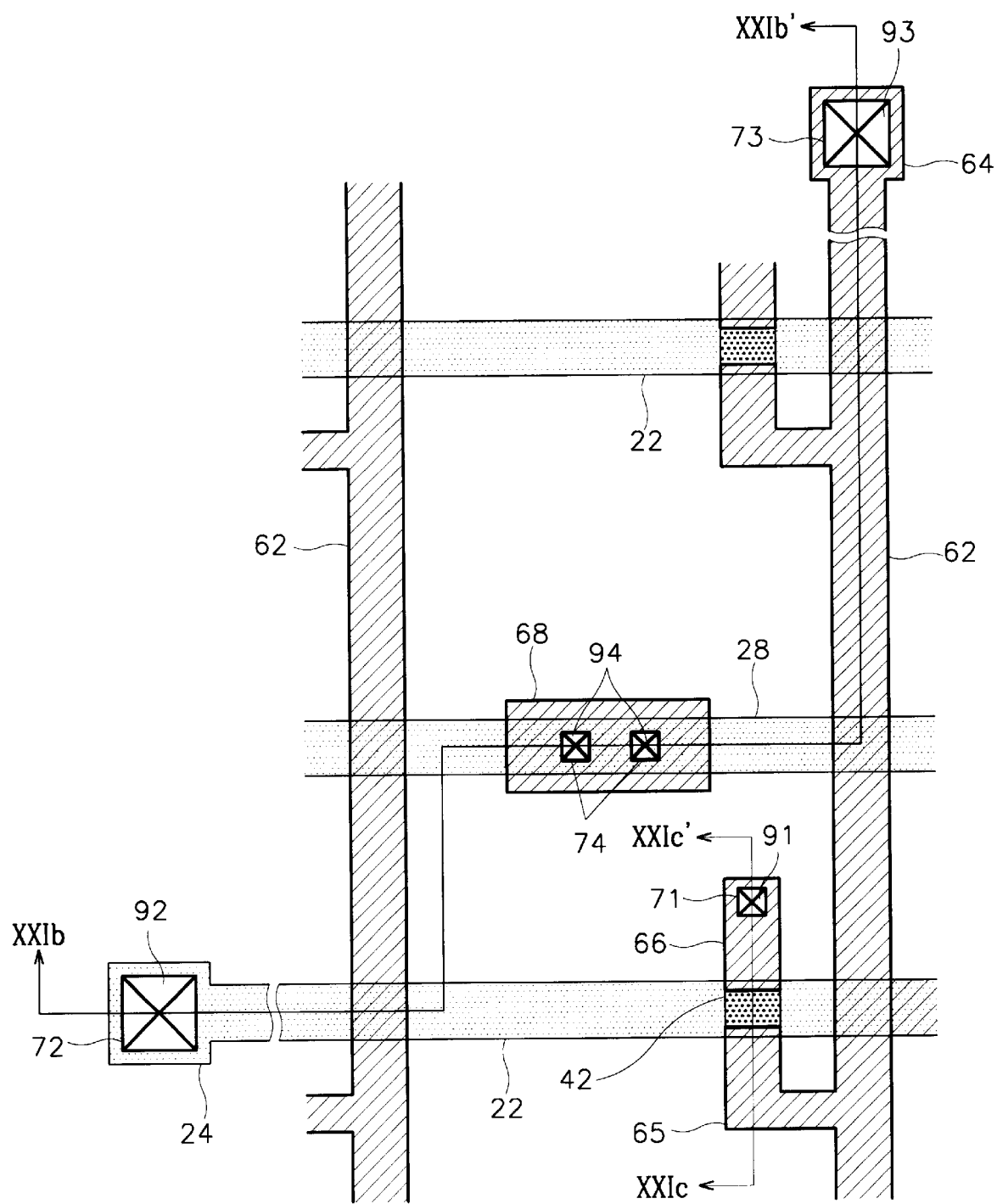
FIG. 21A is a layout view of thin film transistor array panel in the next manufacturing step following that represented in FIGS. 20A and 20B.
Figure 21B:
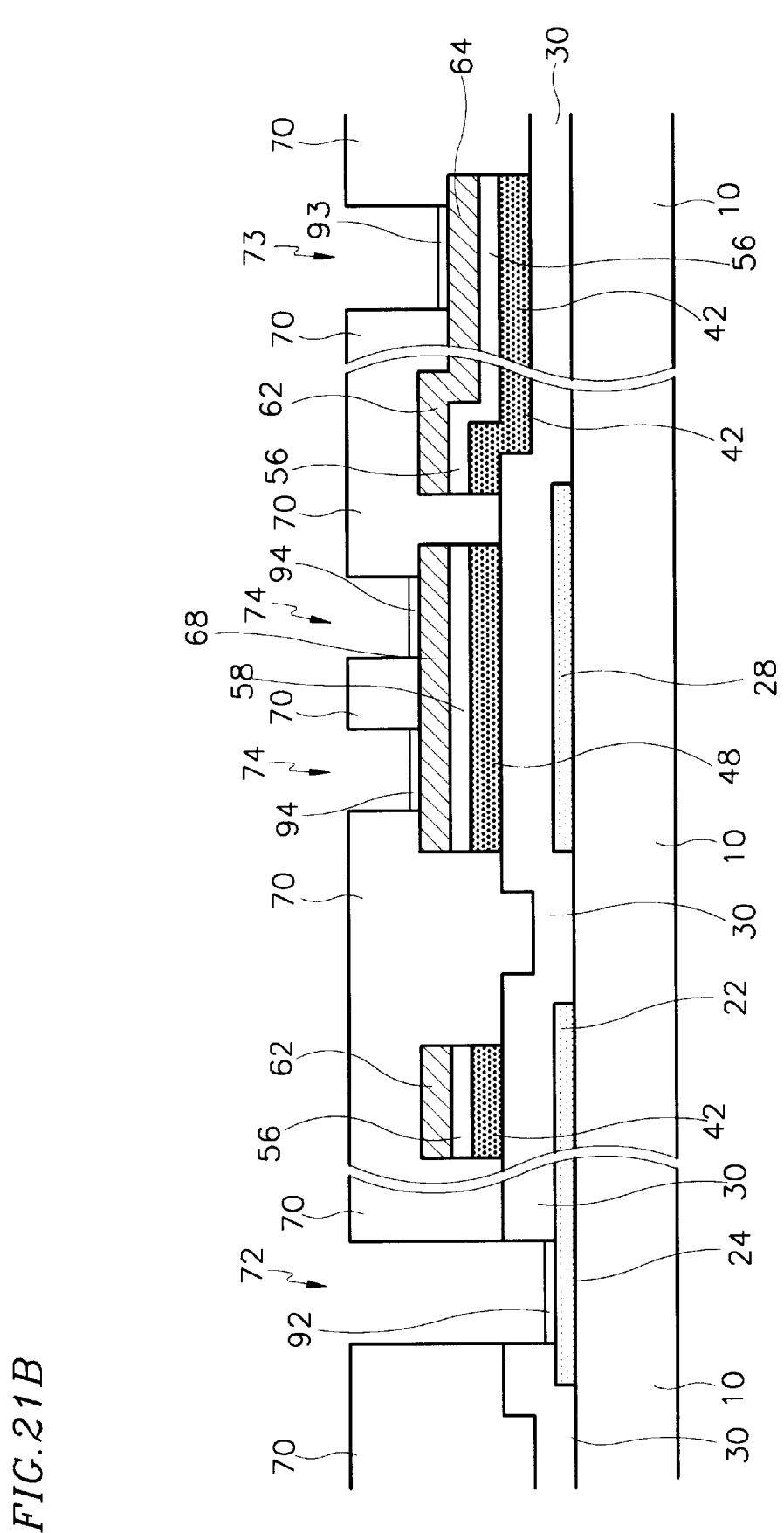
FIGS. 21B and 21C are the cross-sectional views taken along the lines XXIB–XXIB' and XXIC–XXIC' of FIG. 21A, respectively.
Figure 21C:
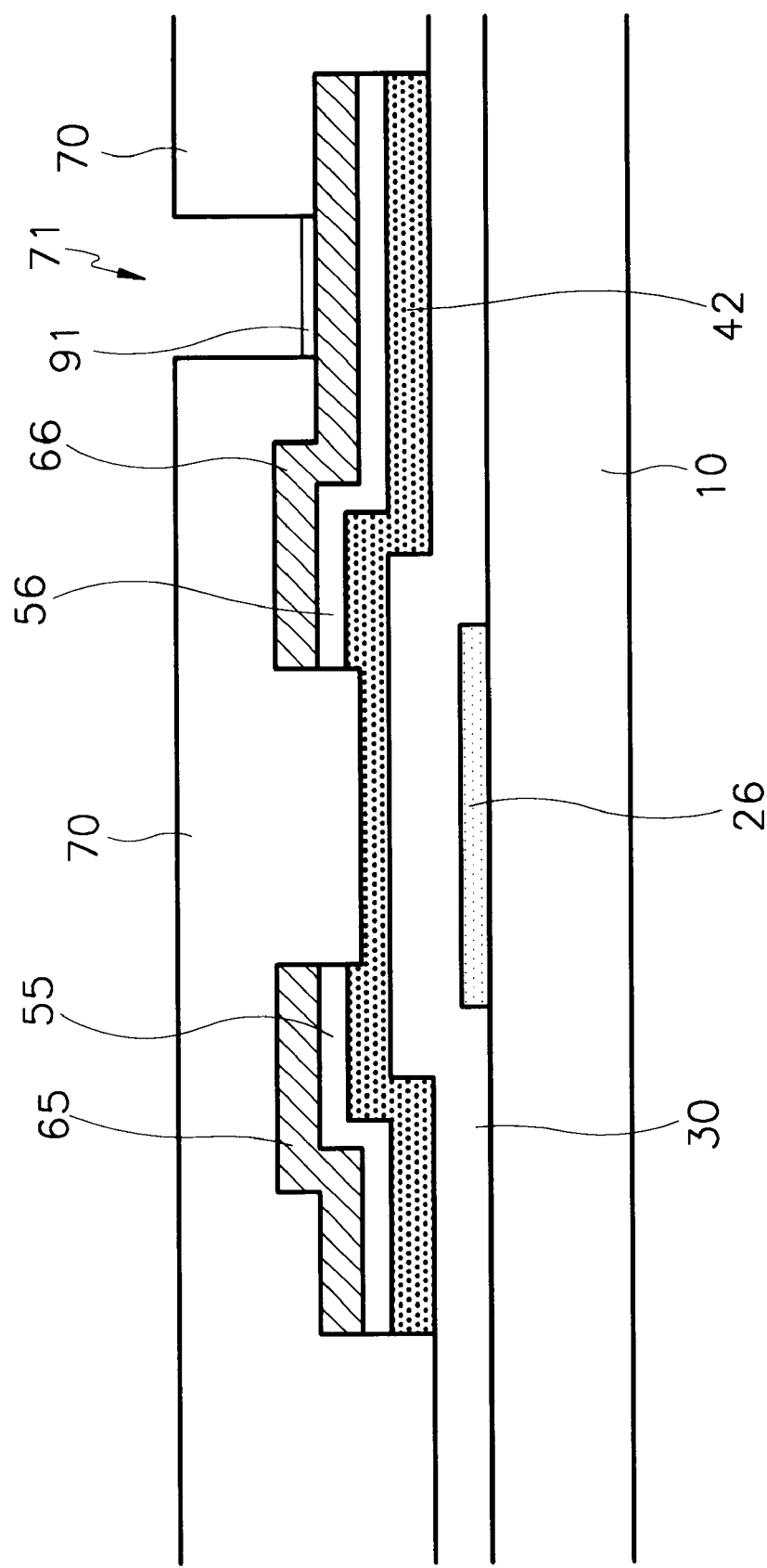

Next, as shown in FIGS. 21A to 21C, the dry cleaning process using gas such as $SF_6/O_2$, $CF_4/O_2$, $BCl_3/Cl_2$ or $BCl_3/HBR_2$ is executed to clean the portions of the drain electrode 66, the gate pad 24, the data pad 68, and the conductor pattern 64, which are exposed through contact holes 71, 72, 73, and 74 respectively. Then, such as the first embodiment, a silicon layer or a transition metal layer is deposited on the substrate 10 and is annealed to form a inter-layer reaction layer 91, 92, 93 and 94 including $Al_xSi_x$ or a transition metal layer on aluminum-based layer of the gate pad 24, and the upper layer 602 of the drain electrode 66, the data pad 68, and the conductor pattern 64. Next, a whole etch process is executed to remove the silicon layer or the transition metal layer.

Figure 8A:
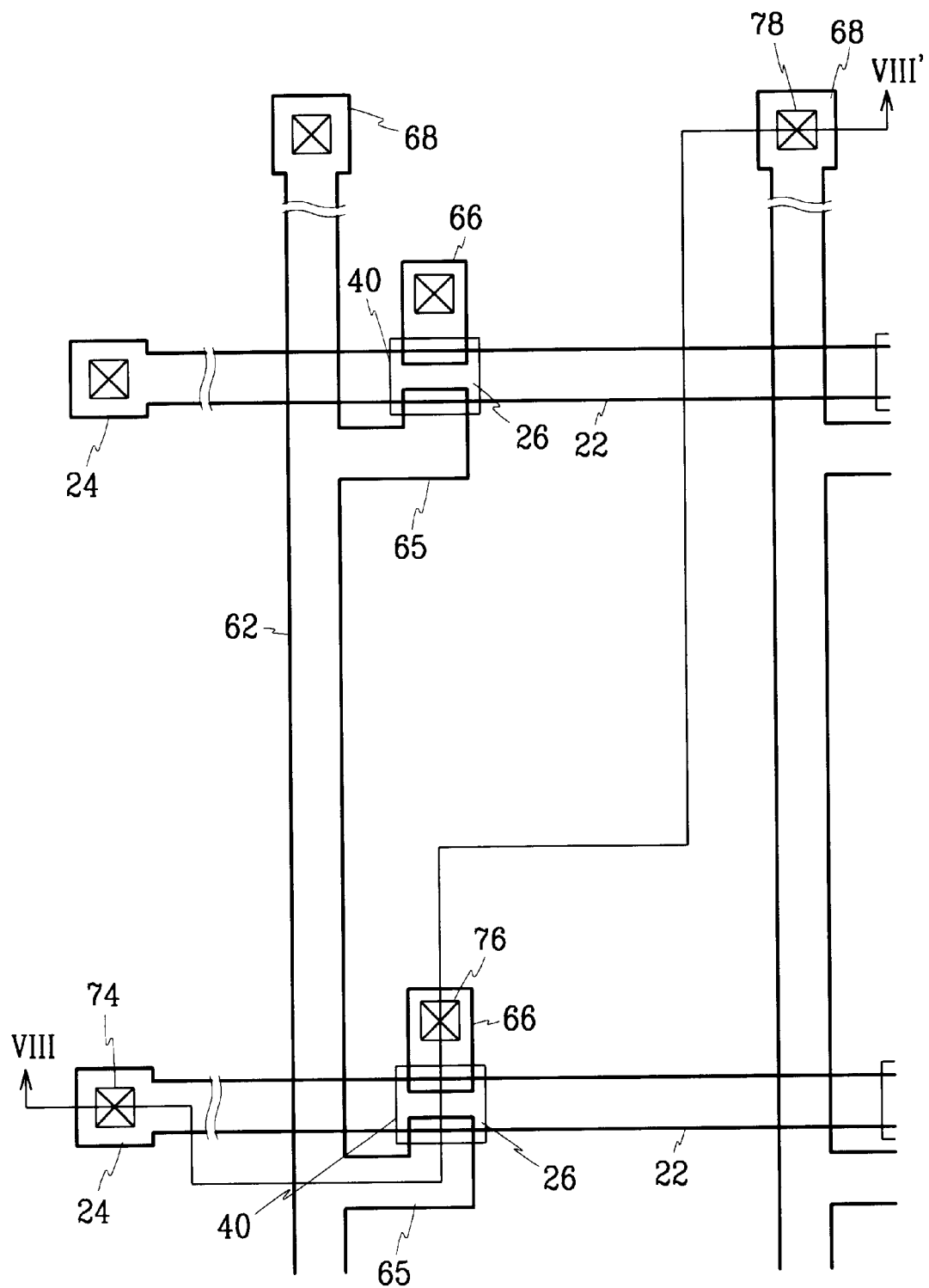
Figure 8B:
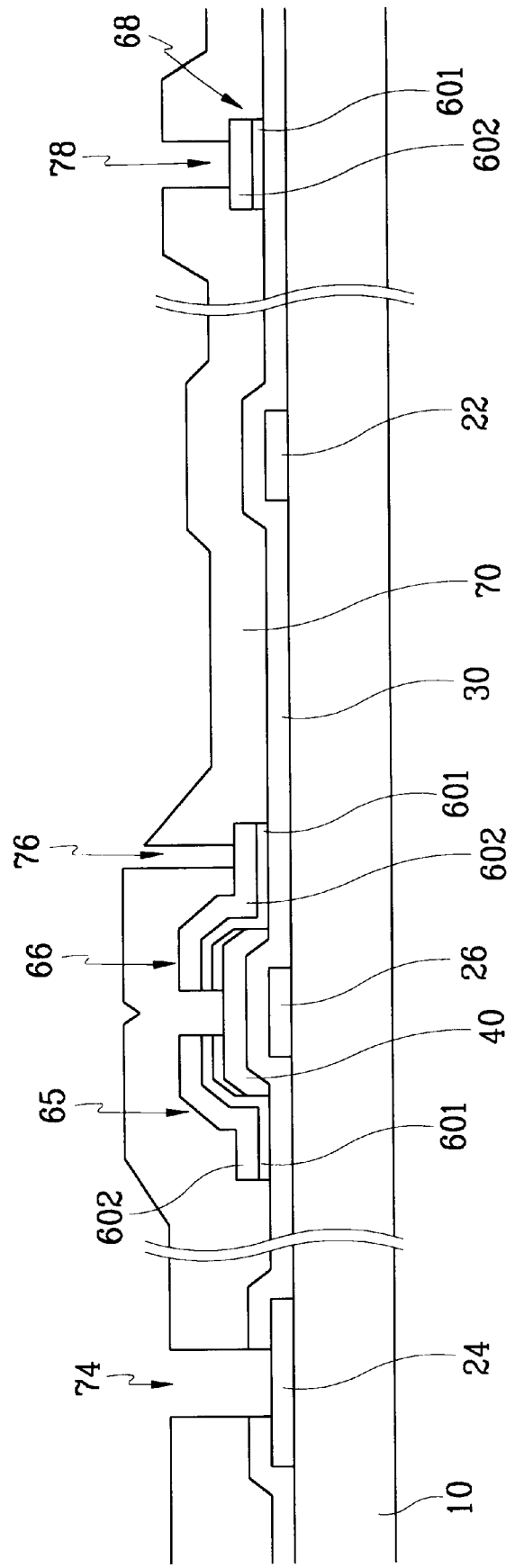
FIG. 8B is cross-sectional view taken along the line VIIIB–VIIIB' of FIG. 8A at the next manufacturing step following that represented in FIG. 7B.

Next, as shown in FIGS. 8 to 10, a IZO layer is deposited having a thickness 400 Å to 500 Å at a temperature of about 150° C., and etched by using a fourth mask to form a pixel electrode 82 electrically connected to the drain electrode 66 and the conductor pattern 64, a redundant gate pad 84 electrically connected to the gate pad 24, and a redundant data pad 86 electrically connected to the data pad 68. Also, in this embodiment according the present invention, to minimize contact resistance of contact portion, it is preferable that the IZO layer is deposited in the range of less than 200° C., and the IZO thin film is formed through sputtering process by using the target including $In_2O_3$ and ZnO and comprising 15–20 at % (atomic percentage) of Zn.

In the third embodiment having the same effects as that of the first embodiment, by forming the data wire parts 62, 64, 65, 66, and 68, the ohmic contact layer pattern 55, 56, and 58, and the semiconductor patterns 42 and 48 through one photolithography process, the manufacturing method of the thin film transistor array panel may be also simplified.

In the thin film transistor completed by the embodiment according to the present invention using the reacting layer including $Al_xSi_x$, the contact resistance of the contact portion measured about 10E4 냉, and is not increased though the annealing process is repeated several times In the embodiment according to the present invention, the reacting layer including $Al_xSi_x$ is used to improve contact prosperities between the metal layer of aluminum-based material and IZO layer, but a inter-layer reaction layer may include another metal and silicon in case of forming a metal wire made of another material except for aluminum-based material, such as chromium, molybdenum and molybdenum alloy. Also, silicon may replace another material.

Furthermore, in the first to third embodiment according to the present invention, the inter-layer reaction layers is formed 91, 92, 93, 94, 96 and 98 after forming the contact holes 71, 72, 73, 74, 76, 78, but inter-layer reaction layers may be formed on the gate and data wire wires before forming the passivation layer 70, and the step removing a buffer layer based on formation of inter-layer reaction layers may be omitted by minimizing the thickness of the buffer layer.

In the embodiments according the present invention, by forming the inter-layer reaction layers including transition metal or silicon between the metal layer of aluminum-based material and the IZO layer, the contact resistance of the contact portions including IZO and the metal layer of aluminum-based material may be minimized and a reliable contact portion including the pad portions may be obtained. Furthermore, by forming the wire of aluminum and aluminum alloy, the characteristics of display device may be improved in large scale LCDs, and by simplifying the manufacturing process, manufacturing costs may also be minimized.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A manufacturing method of a contact structure of a wire comprising steps of:
   forming a wire on a substrate;
   forming an inter-layer reaction layer on the wire by annealing; and
   forming a conductive layer on the inter-layer reaction layer such that the conductive layer is electrically connected to the wire through the inter-layer reaction layer.

2. The method of claim 1, wherein the wire is made of a conductive material including aluminum-based material.

3. The method of claim 1, further comprising the step of forming an insulating layer having a contact hole between the wire and the conductive layer.

4. The method of claim 3, wherein the annealing process is executed before forming the insulating layer.

5. The method of claim 3, wherein the annealing process is executed after forming the insulating layer.

6. The method of claim 1, wherein the inter-layer reaction layer includes silicon or transition metal.

7. The method of claim 3, wherein the inter-layer reaction layer is inter-metallic compound layer.

8. The method of claim 1, wherein the conductive layer is made of a transparent conductive material of indium zinc oxide.

9. The method of claim 1, wherein the annealing process is executed in the range of 200–400° C.

10. A manufacturing method of a thin film transistor array panel comprising steps of:
    forming a gate wire;
    forming a data wire;
    forming a semiconductor layer;
    forming an inter-layer reaction layer on the gate wire and the data wire through annealing process; and
    forming a conductive layer on the inter-layer reaction layer such that the conductive layer is electrically connected to the gate wire or the data wire through the inter-layer reaction layer.

11. The method of claim 10, further comprising the step of forming an insulating layer having a contact hole on the gate or the data wires between the gate or the data wires and the conductive layer.

12. The method of claim 10, wherein the gate wire and the data wire include a conductive material of aluminum-based material.

13. The method of claim 10, wherein the inter-layer reaction layer includes silicon or transition metal.

14. The method of claim 13, wherein the inter-layer reaction layer includes amorphous or doped amorphous silicon.

15. The method of claim 13, wherein the inter-layer reaction layer is an inter-metallic compound.

16. The method of claim 10, wherein the conductive layer is made of indium zinc oxide.

17. The method of claim 10, wherein the annealing process is executed before forming the insulating layer.

18. The method of claim 10, wherein the annealing process is executed after forming the insulating layer.

19. The method of claim 10, wherein the insulating layer is deposited in the range of 200–400° C.

20. The method of claim 10, further comprising the step of executing a wet cleaning process using etchant or a dry cleaning process using plasma before forming the inter-layer reaction layer.

21. A manufacturing method of a thin film transistor array panel for a liquid crystal display comprising steps of:

forming a gate wire including a gate line, and a gate electrode connected to the gate line by depositing and patterning a first conductive material on an insulating substrate;

depositing a gate insulating layer;

forming a semiconductor layer;

forming a data wire including a data line intersecting the gate line, a source electrode connected to the data line and adjacent to the gate electrode and a drain electrode opposite of the source electrode with respect to the gate electrode by depositing and patterning a second conductive material;

depositing a passivation layer;

forming an inter-layer reaction layer on the gate wire and the data wire by executing annealing process;

patterning the passivation layer to form a first contact hole exposing the drain electrode; and forming a pixel electrode electrically connected to the drain electrode through the first contact hole on the passivation layer.

22. The method of claim 21, wherein the first and the second conductive material include a metal of aluminum-based material.

23. The method of claim 21, wherein the annealing process is executed before forming the gate insulating layer or the passivation layer.

24. The method of claim 21, wherein the annealing process is executed after forming the first contact hole.

25. The method of claim 21, wherein the pixel electrode is made of a transparent conductive material.

26. The method of claim 25, wherein the pixel electrode is made of indium zinc oxide.

27. The method of claim 21, wherein the annealing process is executed in the range of 200–400° C.

28. The method of claim 21, wherein the inter-layer reaction layer includes silicon or transition metal.

29. The method of claim 28, wherein the inter-layer reaction layer includes amorphous or doped amorphous silicon.

30. The method of claim 28, wherein the inter-layer reaction layer is an inter-metallic compound.

31. The method of claim 21, wherein the gate wire further includes a gate pad which is connected to the gate line and receives a signal from an external circuit, and the data wire further includes a data pad which is connected to the data line and receives a signal from a external circuit, and the passivation layer and the gate insulating layer have a second contact hole and a third contact hole respectively exposing the inter-layer reaction layer on the gate pad and the data pad, and further comprising the step of forming a redundant gate pad and a redundant data pad which are made of the same layer as the pixel electrode and respectively electrically connected to the gate pad and the data pad through the second and the third contact holes.

32. The method of claim 21, wherein the data wire and the semiconductor layer are together formed by photolithography process using a photoresist pattern having different thicknesses depending the positions.

33. The method of claim 32, wherein the photoresist pattern has a first portion having a first thickness, a second portion having a second thickness larger than the first portion, and a third portion having a third thickness smaller than the first thickness.

34. The method of claim 23, wherein a mask used for forming the photoresist pattern has a first, a second, and a third part, a transmittance of the third part is higher than the first and the second parts, a transmittance of the first part is higher than the second part.

35. The method of claim 34, wherein the first and the second portion of the photoresist pattern are respectively aligned on portion between the source electrode and the drain electrode, and the data wire.

36. The method of claim 35, wherein the first part of the mask includes a partially transparent layer, or a slit pattern smaller than the resolution of the exposure used in the exposing step, to regulate the transmittance of the first part.

37. The method of claim 21, further comprising step of depositing an ohmic contact layer between the data wire and the semiconductor layer.

38. The method of claim 37, wherein the data wire, the ohmic contact layer, and the semiconductor layer are formed in the same photolithography process.

* * * * *

UNITED STATES PATENT AND TRADEMARK OFFICE
CERTIFICATE OF CORRECTION

PATENT NO.    : 6,696,324 B2
DATED         : February 24, 2004
INVENTOR(S)   : Mun-Pyo Hong et al.

It is certified that error appears in the above-identified patent and that said Letters Patent is hereby corrected as shown below:

<u>Column 18,</u>
Line 25, change "claim 23" to -- claim 33 --.

Signed and Sealed this

Twenty-fifth Day of May, 2004

JON W. DUDAS
*Acting Director of the United States Patent and Trademark Office*